US010312884B2

(12) United States Patent
Nomura et al.

(10) Patent No.: US 10,312,884 B2
(45) Date of Patent: Jun. 4, 2019

(54) OSCILLATION MODULE, ELECTRONIC APPARATUS, AND MOVING OBJECT

(71) Applicant: Seiko Epson Corporation, Tokyo (JP)

(72) Inventors: Masataka Nomura, Minowa (JP); Shigeki Sasayama, Fujimi (JP); Akira Nakada, Chino (JP)

(73) Assignee: Seiko Epson Corporation (JP)

( * ) Notice: Subject to any disclaimer, the term of this patent is extended or adjusted under 35 U.S.C. 154(b) by 238 days.

(21) Appl. No.: 15/388,364

(22) Filed: Dec. 22, 2016

(65) Prior Publication Data

US 2017/0201230 A1    Jul. 13, 2017

(30) Foreign Application Priority Data

Jan. 8, 2016 (JP) ................. 2016-002309

(51) Int. Cl.
| | |
|---|---|
| *H03B 5/32* | (2006.01) |
| *H03H 7/06* | (2006.01) |
| *H03H 9/05* | (2006.01) |
| *H03H 9/19* | (2006.01) |
| *H03H 9/64* | (2006.01) |
| *H01L 23/52* | (2006.01) |
| *H01L 23/535* | (2006.01) |
| *H01F 5/04* | (2006.01) |

(Continued)

(52) U.S. Cl.
CPC ............... *H03H 9/19* (2013.01); *H01F 5/00* (2013.01); *H01F 5/04* (2013.01); *H01L 23/52* (2013.01); *H01L 23/535* (2013.01); *H03B 5/30* (2013.01); *H03B 5/326* (2013.01); *H01L 2224/48091* (2013.01); *H01L 2224/48227* (2013.01); *H03H 7/06* (2013.01); *H03H 9/0547* (2013.01); *H03H 9/6436* (2013.01)

(58) Field of Classification Search
CPC ......... H01L 2924/0002; H01L 2924/00; H01L 2924/3011; H01L 41/08; H01L 23/5227; H01L 27/0248; H01L 27/08; H01L 2924/09701; H01L 2224/16145; H01L 23/52; H01L 23/535; H03H 9/19; H03B 5/326; H03B 5/30; H01F 5/04; H01F 5/00
USPC ................. 331/107 A, 167, 117 FE
See application file for complete search history.

(56) References Cited

U.S. PATENT DOCUMENTS

| | | | | |
|---|---|---|---|---|
| 5,045,825 A | * | 9/1991 | McJunkin | H01P 7/04 331/101 |
| 8,669,823 B1 | * | 3/2014 | Olsson | H03B 5/30 331/154 |

(Continued)

FOREIGN PATENT DOCUMENTS

| | | |
|---|---|---|
| JP | 2004-040509 A | 2/2004 |
| JP | 2007-013565 A | 1/2007 |

*Primary Examiner* — Arnold M Kinkead
(74) *Attorney, Agent, or Firm* — Harness, Dickey & Pierce, P.L.C.

(57) ABSTRACT

An oscillation module includes a loop interconnection, a high-frequency output interconnection, a differential amplifier, and an output terminal, the differential amplifier is connected to the output terminal with the high-frequency output interconnection, the high-frequency output interconnection crosses the loop interconnection in a grade-separated manner, and the loop interconnection is different in thickness between a crossing part and a non-crossing part with the high-frequency interconnection.

20 Claims, 9 Drawing Sheets

(51) Int. Cl.
*H01F 5/00* (2006.01)
*H03B 5/30* (2006.01)

(56) References Cited

U.S. PATENT DOCUMENTS 8,884,713 B2 * 11/2014 Tham ..................... H03B 1/04
331/117 FE
2007/0001771 A1 1/2007 Hori et al.

* cited by examiner

OSCILLATION MODULE, ELECTRONIC APPARATUS, AND MOVING OBJECT

BACKGROUND

1. Technical Field

The present invention relates to an oscillation module, and an electronic apparatus and a moving object each equipped with the oscillation module.

2. Related Art

In JP-A-2004-040509 (Document 1), there is disclosed an oscillation circuit constituted by an oscillating differential amplifier formed of an ECL line receiver, a differential amplifier for a feedback buffer, which is formed of an ECL line receiver, and has an output terminal terminated with an emitter termination resistance, a switch circuit, a voltage-controlled phase-shift circuit, an SAW resonator, and an impedance circuit, and in the oscillation circuit, there is formed a positive feedback oscillation loop constituted by at least the oscillation differential amplifier, the differential amplifier for the feedback buffer, the voltage-controlled phase-shift circuit, and the SAW resonator. According to the oscillation circuit, by varying the emitter termination resistance of the differential amplifier for the feedback buffer to increase the drive level of the SAW resonator, the amplitude of a signal from the SAW resonator becomes relatively larger compared to the noise to be superimposed on that signal. In other words, since the high SN ratio can be achieved.

Although the oscillator circuit outputs the oscillation signal with a frequency in the vicinity of the resonance frequency of the SAW resonator, it is also possible to oscillate a signal with a frequency N times of the resonance frequency by providing a multiplier circuit in the posterior stage. In, for example, JP-A-2007-013565 (Document 2), there is disclosed an oscillation circuit having a multiplier circuit in the posterior stage of a ring oscillator. The multiplier circuit has a configuration of outputting an exclusive OR of two signals taken out from any two stages of inverters out of odd number of stages of inverters constituting the ring oscillator, and if, for example, the multiplier circuit described in Document 2 is disposed in the posterior stage of the oscillator circuit described in Document 1, it is possible to obtain a multiplied output while suppressing an increase in the circuit area.

However, since the oscillation circuit described above is in the high frequency range, there is a possibility that the current consumption becomes higher than other oscillator circuits, and the stable power supply for preventing, for example, the voltage drop due to the increase in current consumption becomes a problem to be solved.

With respect to such a problem to be solved, the oscillation circuit described above has a room for improvement in a power supply path from a power supply terminal to each of circuit blocks, and so on.

SUMMARY

An advantage of some aspects of the invention is to provide an oscillation module capable of reducing the variation in power supply. Another advantage of some aspects of the invention is to provide an electronic apparatus and a moving object using the oscillation module.

The invention can be implemented as the following aspects or the application examples.

APPLICATION EXAMPLE 1

An oscillation module according to this application example of the invention includes a loop interconnection, a first interconnection, a first circuit, and a first terminal, the first circuit is connected to the first terminal with the first interconnection, the first interconnection crosses the loop interconnection in a grade-separated manner, and the loop interconnection is different in thickness between a crossing part and a non-crossing part with the first interconnection.

APPLICATION EXAMPLE 2

In the oscillation module according to the application example described above, it is preferable that the crossing part of the loop interconnection includes a multilayer interconnection part disposed in a plurality of wiring layers stacked on one another.

According to these application examples, in the oscillation module, the first interconnection for connecting the first circuit and the first terminal to each other crosses the loop interconnection in a grade-separated manner, and the loop interconnection is different in thickness between the crossing part and the non-crossing part with the first interconnection.

Thus, in the oscillation module, for example, it is possible to make the thickness of the loop interconnection thinner than the non-crossing part in the crossing part with the first interconnection, and thicker than the crossing part in the non-crossing part with the first interconnection.

Further, since there is included the multilayer interconnection part where the crossing part of the loop interconnection is disposed in the plurality of wiring layers stacked on one another, in the case in which the loop interconnection is a power supply line, it is possible to provide a power supply interconnection provided with a sufficient current supply capacity also in the crossing part due to the multilayer interconnection part in addition to the non-crossing part.

APPLICATION EXAMPLE 3

In the oscillation module according to the application example described above, it is preferable that the first interconnection is different in thickness from the crossing part of the loop interconnection.

According to this application example, in the oscillation module, since the first interconnection is different in thickness from the crossing part of the loop interconnection, by, for example, making the thickness of the first interconnection thicker than the thickness of the crossing part of the loop interconnection, it is possible to decrease the impedance of the first interconnection in the crossing part.

Therefore, in the oscillation module, it is possible to improve the characteristic of the signal flowing in the first interconnection.

APPLICATION EXAMPLE 4

In the oscillation module according to the application example described above, it is preferable that the loop interconnection and the first interconnection are disposed in a plurality of wiring layers stacked on one another, and the first interconnection is disposed in the wiring layer, which is the same as the wiring layer of the non-crossing part of the loop interconnection.

According to this application example, in the oscillation module, since the first interconnection is disposed in the same wiring layer as that of the non-crossing part of the loop interconnection, the first interconnection and the non-crossing part of the loop interconnection can be formed in a lump by, for example, the semiconductor manufacturing process.

APPLICATION EXAMPLE 5

In the oscillation module according to the application example described above, it is preferable that defining the thickness of the crossing part of the loop interconnection as A, and the thickness of the non-crossing part as B, A<B is fulfilled.

According to this configuration, in the oscillation module, defining the thickness of the crossing part of the loop interconnection as A, and the thickness of the non-crossing part as B, A<B is fulfilled, and therefore, it is possible to make the thickness of the loop interconnection thinner than the non-crossing part in the crossing part with the first interconnection, and thicker than the crossing part in the non-crossing part with the first interconnection.

Therefore, in the case in which, for example, the loop interconnection is the power supply line, it is possible for the oscillation module to provide the power supply interconnection provided with the sufficient current supply capacity while suppressing the total thickness of the both interconnections in the crossing part.

APPLICATION EXAMPLE 6

In the oscillation module according to the application example described above, it is preferable that the loop interconnection is disposed so as to straddle a plurality of wiring layers stacked on one another, and the non-crossing part is disposed in the wiring layer, which is an upper layer of the wiring layer where the crossing part is disposed.

According to this configuration, in the oscillation module, since the loop interconnection is disposed so as to straddle the plurality of wiring layers stacked on one another, and the non-crossing part is disposed in the wiring layer, which is the upper layer of the wiring layer of the crossing part, it is possible to easily form the non-crossing part so as to be thicker than the crossing part.

APPLICATION EXAMPLE 7

In the oscillation module according to the application example described above, it is preferable that the loop interconnection is a power supply line.

According to this configuration, since the loop interconnection is the power supply line, it is possible for the oscillation module to provide the power supply interconnection provided with the sufficient current supply capacity while suppressing the electrical interference with the first interconnection in the crossing part.

APPLICATION EXAMPLE 8

In the oscillation module according to the application example described above, it is preferable that the first interconnection is a high-frequency signal line.

According to this configuration, since the first interconnection is the high-frequency signal line, it is possible for the oscillation module to provide the high-frequency signal with the noise reduced while suppressing the electrical interference with the loop interconnection in the crossing part.

APPLICATION EXAMPLE 9

An oscillation module according to this application example of the invention includes a loop interconnection, a first circuit block, and a second interconnection and a third interconnection adapted to electrically connect the loop interconnection and the first circuit block to each other, the second interconnection is disposed along a first direction of the first circuit block in a planar view, and the third interconnection is disposed along a second direction different from the first direction of the first circuit block in the planar view.

According to this configuration, in the oscillation module 1, the second interconnection for electrically connecting the loop interconnection and the first circuit block to each other is disposed along the first direction of the first circuit block in the planar view, and the third interconnection for electrically connecting the loop interconnection and the first circuit block to each other in a similar manner is disposed along the second direction of the first circuit block in the planar view.

Thus, it results that in the oscillation module, the first circuit block is supplied with the electrical power from the two directions (through the two paths) in the case in which, for example, the loop interconnection is the power supply line.

Therefore, in the oscillation module, even if the first circuit block is a circuit block relatively high in current consumption, it is possible to supply the sufficient electrical power from the loop interconnection via both of the second interconnection and the third interconnection.

APPLICATION EXAMPLE 10

In the oscillation module according to the application example described above, it is preferable that there is further included a second circuit block, and at least one of the second interconnection and the third interconnection electrically connects the loop interconnection and the first circuit block to each other via the second circuit block.

According to this configuration, in the oscillation module, at least one of the second interconnection and the third interconnection electrically connects the loop interconnection and the first circuit block to each other via the second circuit block.

Therefore, it results that in the oscillation module, the first circuit block is supplied with the electrical power through the two paths via the second circuit block in the case in which, for example, the loop interconnection is the power supply line.

Therefore, in the oscillation module, even if the first circuit block is a circuit block relatively high in current consumption, it is possible to supply the sufficient electrical power from the loop interconnection with little variation via the second circuit block.

Further, in the oscillation module, the layout design including the power supply interconnection can be made more efficient compared to the case of individually supplying the first circuit block and the second circuit block with the electrical power.

APPLICATION EXAMPLE 11

In the oscillation module according to the application example described above, it is preferable that there is further included at least one of a fourth interconnection and a fifth interconnection adapted to electrically connect the loop interconnection and the first circuit block to each other, the fourth interconnection is disposed along a third direction different from the first direction and the second direction of the first circuit block in the planar view, and the fifth interconnection is disposed along a fourth direction different from the first direction, the second direction, the third direction, and the third direction of the first circuit block in the planar view.

According to this configuration, in the oscillator module, since the fourth interconnection is disposed along the third direction in the planar view, and the fifth interconnection is disposed along the fourth direction in the planar view, in the case in which, for example, the loop interconnection is the power supply line, it results that the first circuit block is supplied with the electrical power from the three directions or the four directions (through the three paths or the four paths).

Therefore, in the oscillation module, even if the first circuit block is a circuit block relatively high in current consumption, it is possible to supply the further sufficient electrical power from the loop interconnection with little variation.

APPLICATION EXAMPLE 12

In the oscillation module according to the application example described above, it is preferable that the loop interconnection has a predetermined electrical potential.

According to this configuration, in the oscillation module, since the loop interconnection has the predetermined potential (e.g., VDD, VSS, or a reference voltage), it is possible to reliably operate the first circuit block with the predetermined potential (voltage) using the plurality of paths from the loop interconnection to the first circuit block.

APPLICATION EXAMPLE 13

An electronic apparatus according to this application example includes the oscillation module according to any of the application examples described above.

According to this configuration, since the electronic apparatus is provided with the oscillation module according to any one of the application examples described above, the advantages described in the application example are provided, and the excellent performance can be exerted.

APPLICATION EXAMPLE 14

A moving object according to this application example includes the oscillation module according to any of the application examples described above.

According to this configuration, since the moving object is provided with the oscillation module according to any one of the application examples described above, the advantages described in the application example are provided, and the excellent performance can be exerted.

BRIEF DESCRIPTION OF THE DRAWINGS

The invention will be described with reference to the accompanying drawings, wherein like numbers reference like elements.

DESCRIPTION OF EXEMPLARY EMBODIMENTS

Some preferred embodiments of the invention will hereinafter be described in detail using the accompanying drawings. It should be noted that the embodiments described below do not unreasonably limit the content of the invention as set forth in the appended claims. Further, all of the constituents described below are not necessarily essential elements of the invention.

1. Oscillation Module 1-1. Structure of Oscillation Module

Figure 1:
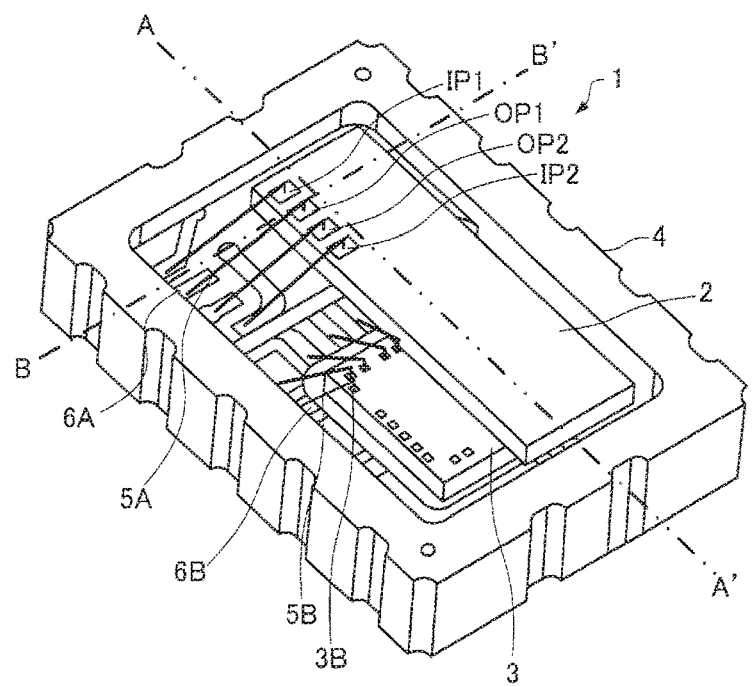
FIG. 1 is a perspective view of an oscillation module 1 according to an embodiment of the invention.
Figure 2:
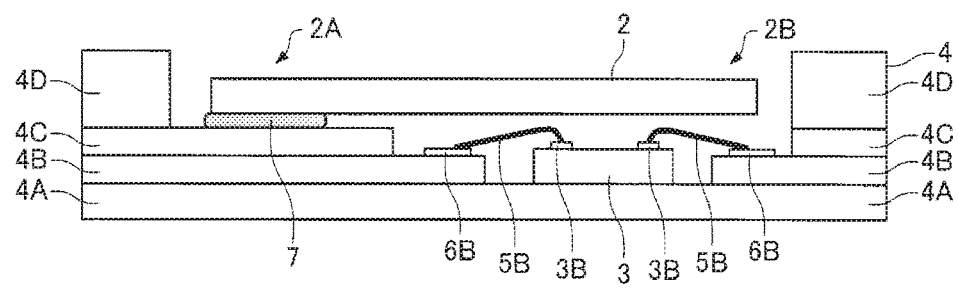
FIG. 2 is a cross-sectional view of the oscillation module 1 cut along the line A-A' shown in FIG. 1.
Figure 3:
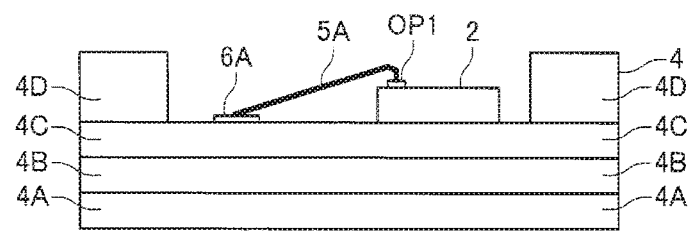
FIG. 3 is a cross-sectional view of the oscillation module 1 cut along the line B-B' shown in FIG. 1.

FIG. 1 is a diagram showing an example of a structure of an oscillation module 1 according to the present embodiment, and is a perspective view of the oscillation module 1. Further, FIG. 2 is a cross-sectional view of the oscillation module 1 cut along the line A-A' shown in FIG. 1, and FIG. 3 is a cross-sectional view of the oscillation module 1 cut along the line B-B' shown in FIG. 1. It should be noted that although in FIG. 1 through FIG. 3, there is illustrated the oscillation module 1 in the state in which a lid is removed, in reality, the oscillation module 1 is constituted with an opening of the package 4 covered with the lid not shown.

As shown in FIG. 1, the oscillation module 1 according to the present embodiment is configured including an SAW (surface acoustic wave) filter (a surface acoustic wave filter) 2, an integrated circuit (IC) 3, and a package 4.

The package 4 is a stacked package such as a ceramic package, and houses the SAW filter 2 and the integrated circuit 3 in the same space. Specifically, an opening part is provided in an upper part of the package 4, a housing chamber is formed by covering the opening part with the lid not shown, and the SAW filter 2 and the integrated circuit 3 are housed in the housing chamber.

As shown in FIG. 2, the lower surface of the integrated circuit 3 is bonded and fixed to the upper surface of a first layer 4A of the package 4. Further, electrodes (pads) 3B disposed on the upper surface of the integrated circuit 3 and electrodes 6B disposed on the upper surface of the second layer 4B of the package 4 are respectively bonded to each other with wires 5B.

One of the end parts of the SAW filter 2 is fixed firmly to the package 4. More specifically, the lower surface of one (a first end part) 2A of the end parts in the longitudinal direction of the SAW filter 2 is bonded and fixed to the upper surface of a third layer 4C of the package 4 with an adhesive 7. Further, the other (a second end part) 2B of the end parts in the longitudinal direction of the SAW filter 2 is not fixed, and further, there is provided a gap between the second end part 2B and an inner surface of the package 4. In other words, the SAW filter 2 is fixed to the package 4 to form a cantilever structure.

It should be noted that there is adopted a configuration in which a fourth layer 4D of the package 4 is disposed in the outer periphery of the upper surface of the third layer 4C of the package 4, and the lid not shown is bonded on the upper surface of the fourth layer 4D.

As shown in FIG. 1, in the first end part 2A on the upper surface of the SAW filter 2, there are disposed four electrodes (also referred to as bonding terminals) respectively functioning as a first input port IP1, a second input port IP2, a first output port OP1, and a second output port OP2. Further, as shown in FIG. 1 and FIG. 3, the first input port IP1, the second input port IP2, the first output port OP1, and the second output port OP2 of the SAW filter 2 and four electrodes 6A disposed on the upper surface of the third layer 4C of the package 4 are respectively bonded to each other with wires 5A.

Inside the package 4, there are disposed interconnections not shown for electrically connecting the four electrodes 6A and the predetermined four electrodes 6B respectively to each other. Specifically, the first input port IP1, the second input port IP2, the first output port OP1, and the second output OP2 of the SAW filter 2 are respectively connected to the four electrodes (pads) 3B of the integrated circuit 3 different from each other via the wires 5A, the wires 5B, and the internal interconnections of the package 4.

Further, on the surface (outer surface) of the package 4, there is disposed a plurality of external electrodes not shown functioning as power supply terminals, ground terminals, or output terminals, and inside the package 4, there are also disposed interconnections not shown for electrically connecting the external electrodes and the predetermined electrodes 6B respectively to each other.

Figure 4:
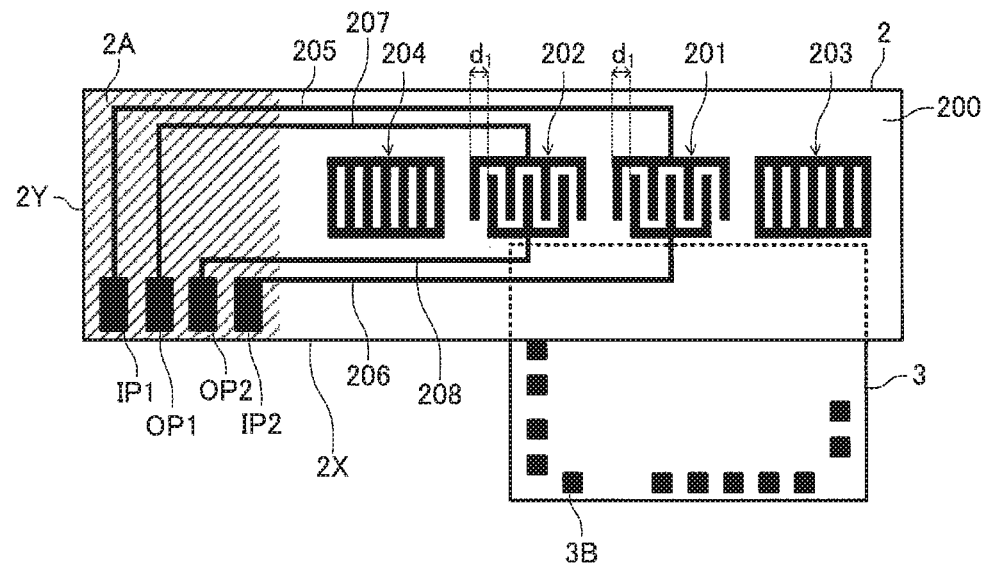
FIG. 4 is a plan view of an SAW filter 2 and an integrated circuit 3.

FIG. 4 is a plan view of the SAW filter 2 and the integrated circuit 3 when viewing the oscillation module 1 shown in FIG. 1 from the upper surface thereof.

As shown in FIG. 4, the SAW filter 2 has a first interdigital transducer (IDT) 201, a second IDT 202, a first reflector 203, and a second reflector 204.

The piezoelectric substrate 200 can be manufactured using a single-crystal material such as a quartz crystal, a lithium niobate (LiNbO$_3$), a lithium tantalate (LiTaO$_3$), or a lithium tetraborate (Li$_2$B$_4$O$_7$, LBO), a piezoelectric thin film made of a zinc oxide (ZnO), an aluminum nitride (AlN), or the like, or a piezoelectric ceramic material.

The first IDT 201 and the second IDT 202 are located between the first reflector 203 and the second reflector 204, and each have two electrodes, each of which has a plurality of electrode fingers disposed at regular intervals, arranged so that the electrode fingers interdigitate with each other. Further, as shown in FIG. 4, the electrode finger pitches of the first IDT 201 and the second IDT 202 are both set to a constant value $d_1$.

Further, the SAW filter 2 has the first input port IP1 connected to the first IDT 201, the second input port IP2 connected to the first IDT 201, the first output port OP1 connected to the second IDT 202, and the second output port OP2 connected to the second IDT 202, disposed on the surface of the piezoelectric substrate 200.

Specifically, on the surface of the piezoelectric substrate 200, there are disposed a first interconnection 205 and a second interconnection 206, the first input port IP1 is connected to one (upper one in FIG. 4) of the electrodes of the first IDT 201 with the first interconnection 205, and the second input port IP2 is connected to the other (lower one in FIG. 4) of the electrodes of the first IDT 201 with the second interconnection 206. Further, on the surface of the piezoelectric substrate 200, there are disposed a third interconnection 207 and a fourth interconnection 208, the first output port OP1 is connected to one (upper one in FIG. 4) of the electrodes of the second IDT 202 with the third interconnection 207, and the second output port OP2 is connected to the other (lower one in FIG. 4) of the electrodes of the second IDT 202 with the fourth interconnection 208.

In the SAW filter 2 configured in such a manner, when an electrical signal having a frequency in the vicinity of $f=v/(2d_1)$ (v denotes a speed of the surface acoustic wave propagating on the surface of the piezoelectric substrate 200) is input from the first input port IP1 and the second input port IP2, a surface acoustic wave having a wavelength equal to $2d_1$ is excited by the first IDT 201. Then, the surface acoustic wave thus excited by the first IDT 201 is reflected between the first reflector 203 and the second reflector 204 to turn to a standing wave. The standing wave is converted in the second IDT 202 into an electrical signal, and is output from the first output port OP1 and the second output port OP2. In other words, the SAW filter 2 functions as a narrow-band band-pass filter with a center frequency of $f=v/(2d_1)$.

In the present embodiment, as shown in FIG. 4, at least a part of the SAW filter 2 overlaps the integrated circuit 3 in a planar view. Further, in the planar view, the first end part 2A (the part with the hatching in FIG. 4) of the SAW filter 2 does not overlap the integrated circuit 3. In the present embodiment, by fixing the first end part 2A of the SAW filter 2 to the package 4 to cantilever the SAW filter 2, and disposing the integrated circuit 3 in the space formed below the SAW filter 2 as described above, miniaturization of the oscillation module 1 is realized.

Further, according to the oscillation module 1 of the present embodiment, since the first end part 2A, which is a part of the surface of the SAW filter 2, is fixed firmly to the package 4 instead of the entire surface of the SAW filter 2, the area of the part fixed firmly is small, and thus, the part easily deformed by the stress applied by the package is small. Therefore, according to the oscillation module 1 of the present embodiment, the deterioration of the oscillation signal due to the stress applied to the SAW filter 2 can be reduced.

Further, since the reverse surface of the piezoelectric substrate 200 in the first end part 2A of the SAW filter 2 is fixed to the package 4 with the adhesive 7, the first end part 2A is easily deformed due to shrinkage of the adhesive 7. Therefore, in the present embodiment, as shown in FIG. 4, the first IDT 201, the second IDT 202, the first reflector 203, and the second reflector 204 are not disposed on the surface of the piezoelectric substrate 200 in the first end part 2A. Thus, the deformation of the first IDT 201 and the second IDT 202 is significantly reduced. Therefore, according to the present embodiment, since it is possible to reduce the error of the electrode finger pitch $d_1$ with respect to a target value caused by the deformation of the first IDT 201 and the second IDT 202 due to the stress by the shrinkage of the adhesive 7, the oscillation module 1 high in frequency accuracy can be realized.

Further, in the present embodiment, by cantilevering the SAW filter 2, the stress due to the contact with the package 4 is not applied to the second end part 2B, which is a free end. Therefore, according to the present embodiment, since the deformation of the first IDT 201 and the second IDT 202 caused by the stress due to the contact with the package 4 does not occur, it is possible to realize the oscillation module 1 high in frequency accuracy.

Further, in the present embodiment, the first input port IP1, the second input port IP2, the first output port OP1, and the second output port OP2, which are not changed in characteristics by the deformation, are disposed on the surface of the piezoelectric substrate 200 in the first end part 2A of the SAW filter 2. Thus, the SAW filter 2 is prevented from becoming unnecessarily large to make the miniaturization of the oscillation module 1 possible.

Further, in the present embodiment, as shown in FIG. 4, the SAW filter 2 has a rectangular shape having long sides 2X and short sides 2Y, and the first input port IP1, the second input port IP2, the first output port OP1, and the second output port OP2 are arranged along the long side 2X of the SAW filter 2 in the planar view. Therefore, according to the present embodiment, since all of the four wires 5A connected respectively to the first input port IP1, the second input port IP2, the first output port OP1, and the second output port OP2 can be disposed around the long side 2X in the outside of the SAW filter 2 as shown in FIG. 1, it is possible to efficiently use the space around the long side of the SAW filter 2 in the inside of the package 4 to thereby decrease the space around the short side. Therefore, the oscillation module 1 can be miniaturized.

Further, in the present embodiment, as shown in FIG. 4, the first input port IP1 and the second input port IP2 are arranged with distances equal to each other from the long side 2X, and the first output port OP1 and the second output port OP2 are arranged with distances equal to each other from the long side 2X in the planar view. Therefore, according to the present embodiment, it is possible to make the length of the interconnection (the wire 5A and the substrate interconnection) connected to the first input port IP1 and the length of the interconnection connected to the second input port IP2 easy to uniform, to make the length of the interconnection connected to the first output port OP1 and the length of the interconnection connected to the second output port OP2 easy to uniform, and to reduce the phase difference of the differential signal input to or output from the SAW filter 2.

Further, in the present embodiment, as shown in FIG. 4, the first input port IP1, the second input port IP2, the first output port OP1, and the second output port OP2 are arranged with distances equal to each other from the long side 2X in the planar view. Therefore, it is easy to uniform the heights of the four wires 5A connected respectively to the first input port IP1, the second input port IP2, the first output port OP1, and the second output port OP2.

Figure 5:
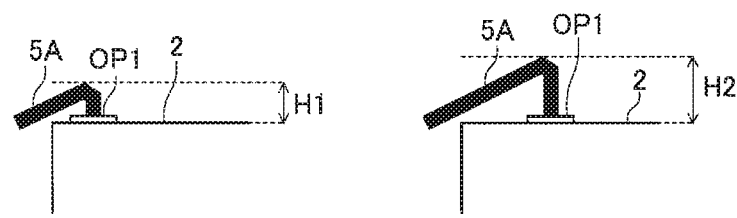
FIG. 5 is a diagram showing a bonding terminal part of the oscillation module 1 according to the embodiment.

In particular, in the present embodiment, since the first input port IP1, the second input port IP2, the first output port OP1, and the second output port OP2 are disposed along the long side 2X at positions close to the long side 2X, the height H1 of the highest part of each of the wires 5A from the upper surface of the SAW filter 2 can be decreased as shown in the cross-sectional view (the cross-sectional view illustrating a part of FIG. 3) on the left side of FIG. 5. On the right side of FIG. 5, there is shown a cross-sectional view in the case in which the first input port IP1, the second input port IP2, the first output port OP1, and the second output port OP2 are supposedly disposed at positions further from the long side 2X, and the height H2 of the highest part of each of the wires 5A from the upper surface of the SAW filter 2 is larger than the height H1. As described above, according to the present embodiment, since the wires 5A can be lowered, it becomes possible to reduce the size in the height direction of the package 4, and the miniaturization of the oscillation module 1 can be realized.

Further, in the present embodiment, as shown in FIG. 4, the first input port IP1, the first output port OP1, the second output port OP2, and the second input port IP2 are arranged in the direction along the long side 2X in this order in the planar view. Thus, in the case of arranging the first IDT 201 and the second IDT 202 in the direction along the long side 2X, it becomes easy to dispose the first interconnection 205, the second interconnection 206, the third interconnection 207, and the fourth interconnection 208 without crossing each other, and the lengths of the interconnections can be shortened.

It should be noted that the SAW filter 2 is not limited to the configuration shown in FIG. 4, but can also be, for example, a transversal SAW filter in which the reflectors are not provided, and the surface acoustic wave propagates between the IDT for input and the IDT for output.

1-2. Functional Configuration of Oscillation Module

Figure 6:
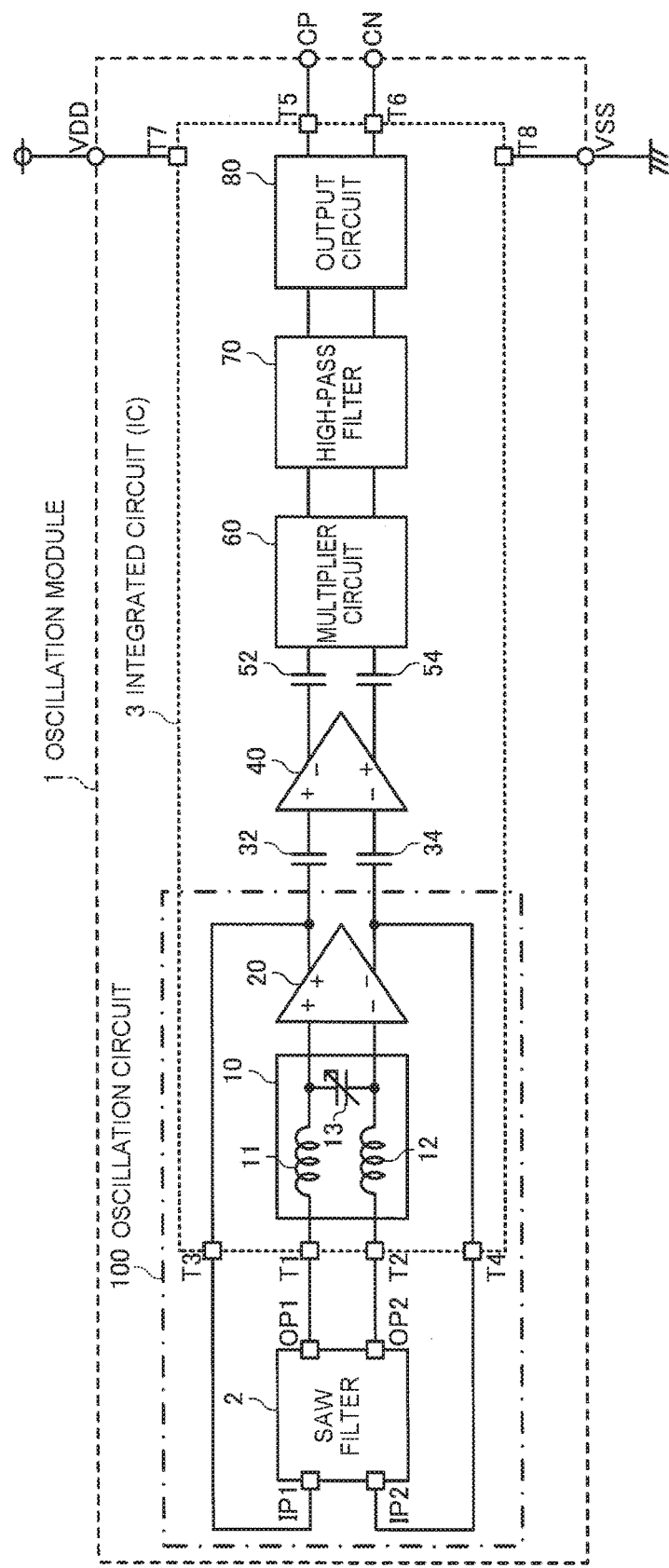
FIG. 6 is a block diagram showing an example of a functional configuration of the oscillation module 1 according to the embodiment.

FIG. 6 is a block diagram showing an example of a functional configuration of the oscillation module 1 according to the present embodiment. As shown in FIG. 6, the oscillation module 1 according to the present embodiment is configured including the SAW filter 2, a phase shift circuit 10, a differential amplifier 20, a capacitor 32, a capacitor 34, a differential amplifier 40, a capacitor 52, a capacitor 54, a multiplier circuit 60, a high-pass filter 70 (a filter circuit), and an output circuit 80. It should be noted that the oscillation module 1 according to the present embodiment can be provided with a configuration obtained by arbitrarily eliminating or modifying some of these constituents, or adding other constituents.

The phase shift circuit 10, the differential amplifier 20, the capacitor 32, the capacitor 34, the differential amplifier 40, the capacitor 52, the capacitor 54, the multiplier circuit 60, the high-pass filter 70, and the output circuit 80 are included in the integrated circuit 3. In other words, each of these circuits is a part of the integrated circuit 3.

The first output port OP1 of the SAW filter 2 is connected to an input terminal T1 of the integrated circuit 3. Further, the second output port OP2 of the SAW filter 2 is connected to an input terminal T2 of the integrated circuit 3. Further, the first input port IP1 of the SAW filter 2 is connected to an output terminal T3 of the integrated circuit 3. Further, the second input port IP2 of the SAW filter 2 is connected to an output terminal T4 of the integrated circuit 3.

A power supply terminal T7 of the integrated circuit 3 is connected to a VDD terminal, which is the external terminal (the external terminal disposed on the surface of the package 4) of the oscillation module 1, and a desired power supply potential is supplied to the power supply terminal T7 via the VDD terminal. Further, a ground terminal T8 of the integrated circuit 3 is connected to a VSS terminal, which is the external terminal of the oscillation module 1, and a ground potential (0V) is supplied to the ground terminal T8 via the VSS terminal. Further, the phase shift circuit 10, the differential amplifier 20, the capacitor 32, the capacitor 34, the differential amplifier 40, the capacitor 52, the capacitor 54, the multiplier circuit 60, the high-pass filter 70, and the output circuit 80 operate using the potential difference between the power supply terminal T7 and the ground terminal T8 as a power supply voltage. It should be noted that the power supply terminals and the ground terminals of the differential amplifier 20, the differential amplifier 40, the multiplier circuit 60, the high-pass filter 70, and the output circuit 80 are connected respectively to the power supply terminal T7 and the ground terminal T8, but are omitted from the illustration in FIG. 6.

The phase shift circuit 10 and the differential amplifier 20 are disposed on a feedback path from the first output port OP1 and the second output port OP2 to the first input port IP1 and the second input port IP2 of the SAW filter 2.

The phase shift circuit 10 has a coil 11, a coil 12, and a variable-capacitance element 13. The inductance of the coil 11 and the inductance of the coil 12 are the same (a difference due to the manufacturing tolerance is allowed) or can also be comparable with each other.

One end of the coil 11 is connected to the input terminal T1 of the integrated circuit 3, and the other end of the coil 11 is connected to one end of the variable-capacitance element 13 and a non-inverting input terminal of the differential amplifier 20. Further, one end of the coil 12 is connected to the input terminal T2 of the integrated circuit 3, and the other end of the coil 12 is connected to the other end of the variable-capacitance element 13 and an inverting input terminal of the differential amplifier 20.

The variable-capacitance element 13 can be, for example, a varactor (also referred to as a varicap or a variable-capacitance diode) varying in capacitance value in accordance with a voltage applied, or can also be a circuit, which includes a plurality of capacitors and a plurality of switches for selecting at least a part of the plurality of capacitors, and the capacitance value of which is changed in accordance with the capacitors selected by opening or closing the switches in accordance with selection signals.

The differential amplifier 20 amplifies the potential difference between a pair of signals input to the non-inverting input terminal and the inverting input terminal, and then outputs the result from a non-inverted output terminal and an inverted output terminal. The non-inverted output terminal of the differential amplifier 20 is connected to the output terminal T3 of the integrated circuit 3 and one end of the capacitor 32. Further, the inverted output terminal of the differential amplifier 20 is connected to the output terminal T4 of the integrated circuit 3 and one end of the capacitor 34.

Figure 7:
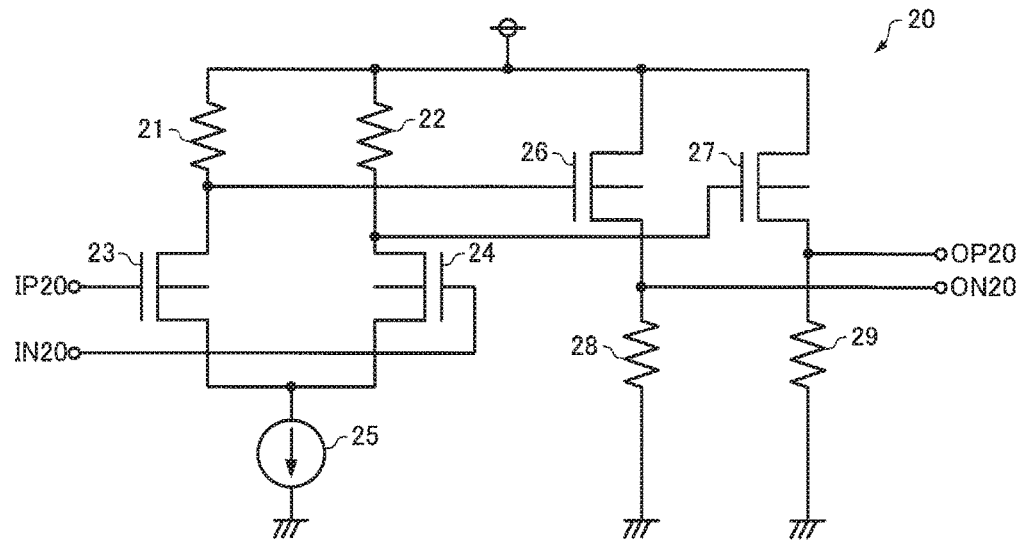
FIG. 7 is a diagram showing an example of a circuit configuration of a differential amplifier 20.

FIG. 7 is a diagram showing an example of a circuit configuration of the differential amplifier 20. In the example shown in FIG. 7, the differential amplifier 20 is configured including a resister 21, a resister 22, an NMOS (N-channel metal oxide semiconductor) transistor 23, an NMOS transistor 24, a constant current source 25, an NMOS transistor 26, an NMOS transistor 27, a resistor 28, and a resistor 29. In FIG. 7, for example, an input terminal IP20 is a non-inverting input terminal, and an input terminal IN20 is an inverting input terminal. Further, an output terminal OP20 is a non-inverted output terminal, and an output terminal ON20 is an inverted output terminal.

In the NMOS transistor 23, the gate terminal is connected to the input terminal IP20, the source terminal is connected to one end of the constant current source 25, and the drain terminal is connected to the power supply terminal T7 (see FIG. 6) via the resistor 21.

In the NMOS transistor 24, the gate terminal is connected to the input terminal IN20, the source terminal is connected to the one end of the constant current source 25, and the drain terminal is connected to the power supply terminal T7 (see FIG. 6) via the resistor 22.

The other end of the constant current source 25 is connected to the ground terminal T8 (see FIG. 6).

In the NMOS transistor 26, the gate terminal is connected to the drain terminal of the NMOS transistor 23, the source terminal is connected to the ground terminal T8 (see FIG. 6) via the resistor 28, and the drain terminal is connected to the power supply terminal T7 (see FIG. 6).

In the NMOS transistor 27, the gate terminal is connected to the drain terminal of the NMOS transistor 24, the source terminal is connected to the ground terminal T8 (see FIG. 6) via the resistor 29, and the drain terminal is connected to the power supply terminal T7 (see FIG. 6).

Further, the source terminal of the NMOS transistor 26 is connected to the output terminal ON20, and the source terminal of the NMOS transistor 27 is connected to the output terminal OP20.

The differential amplifier 20 configured as described above non-inversely amplifies a pair of signals input to the input terminal IP20 and the input terminal IN20, and then outputs the result from the output terminal OP20 and the output terminal ON20.

Going back to FIG. 6, in the present embodiment, due to the SAW filter 2, the phase shift circuit 10, and the differential amplifier 20, a pair of signals propagate on the signal path from the first output port OP1 and the second output port OP2 to the first input port IP1 and the second input port IP2 of the SAW filter 2 to form a positive-feedback closed loop, and the pair of signals turn to an oscillation signal. Therefore, the SAW filter 2, the phase shift circuit 10, and the differential amplifier 20 constitute an oscillation circuit 100. It should be noted that the oscillation circuit 100 can have a configuration obtained by arbitrarily eliminating or modifying some of these constituents, or adding other constituents.

Figure 8:
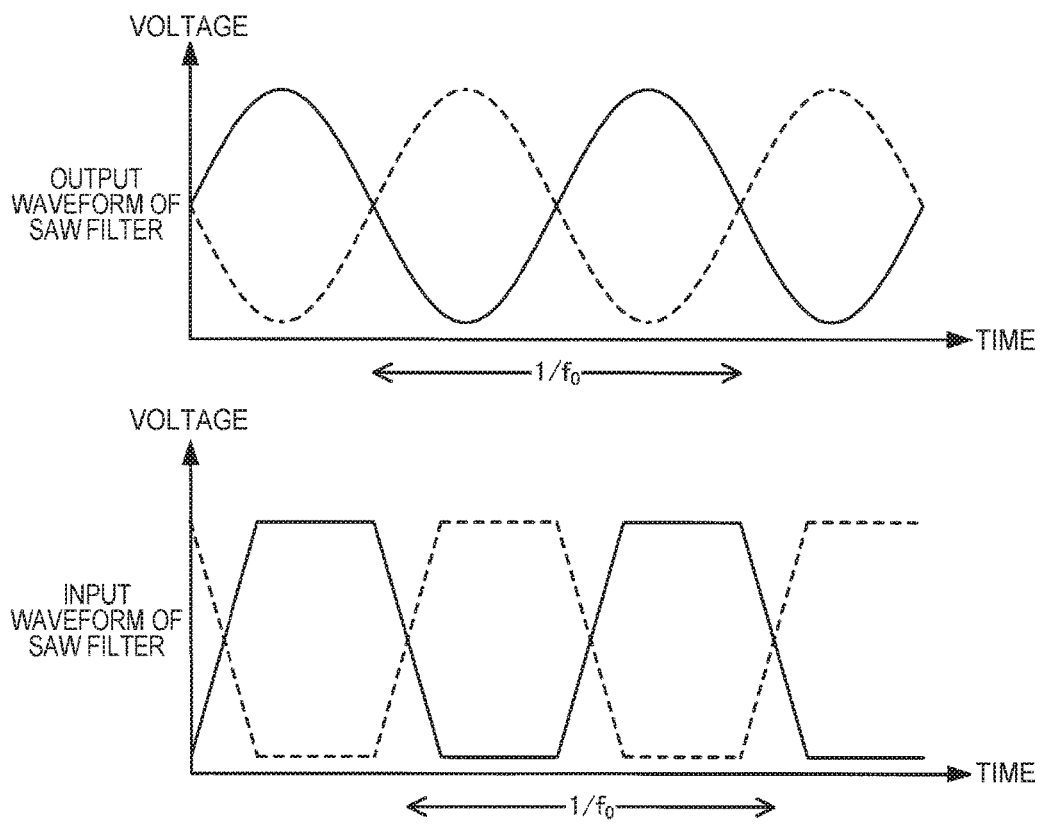
FIG. 8 is a diagram showing an example of input and output waveforms of the SAW filter 2.

In the upper part of FIG. 8, the waveform of the signal (frequency $f_0$) output from the first output port OP1 of the SAW filter 2 is indicated by the solid line, and the waveform of the signal (frequency $f_0$) output from the second output port OP2 of the SAW filter 2 is indicated by the dotted line. Further, in the lower part of FIG. 8, the waveform of the signal (frequency $f_0$) input to the first input port IP1 of the SAW filter 2 is indicated by the solid line, and the waveform of the signal (frequency $f_0$) input to the second input port IP2 of the SAW filter 2 is indicated by the dotted line.

As shown in FIG. 8, the signal (the solid line) propagating from the first output port OP1 to the first input port IP1 of the SAW filter 2 and the signal (the dotted line) propagating from the second output port OP2 to the second input port IP2 of the SAW filter 2 are reversed in phase from each other. Here, "reversed in phase from each other" is a concept including not only the case in which the phase difference is accurately 180°, but also the case in which, for example, the phase difference is different from 180° as much as the difference in the characteristics between the elements provided to the differential amplifier 20 caused by a difference in length, resistance, and capacitance between the interconnection of the feedback path from the first output port OP1 to the first input port IP1 of the SAW filter 2 and the interconnection of the feedback path from the second output port OP2 to the second input port IP2 of the SAW filter 2, and the production error.

As described above, the oscillation circuit 100 of the present embodiment amplifies the differential signals (the pair of signals reversed in phase from each other) output from the first output port OP1 and the second output port OP2 of the SAW filter 2 with the differential amplifier 20, feeds the result back to the first input port IP1 and the second input port IP2 of the SAW filter 2 to thereby constitute the closed-loop feedback path, and thus oscillates. Specifically, the oscillation circuit 100 acts in a differential manner, and oscillates with the frequency $f_0$ corresponding to the electrode finger pitch $d_1$ of the first IDT 201 and the second IDT 202.

Further, the power supply noise superimposed on the differential signals, which propagate on the feedback path from the first output port OP1 and the second output port OP2 to the first input port IP1 and the second input port IP2 of the SAW filter 2, via the power supply line is a common-mode noise, and is therefore significantly reduced by the differential amplifier 20. Therefore, according to the oscillation circuit 100, it is possible to reduce the deterioration of the oscillation signal due to the influence of the power supply noise to thereby improve the frequency accuracy and the S/N ratio of the oscillation signal.

Further, the oscillation circuit 100 according to the present embodiment is capable of changing the frequency $f_0$ of the oscillation signal with a variation corresponding to the inductance of the coil 11 and the inductance of coil 12 within the passband of the SAW filter 2 by varying the capacitance value of the variable-capacitance element 13 of the phase shift circuit 10. The higher the inductance of the coil 11 and the inductance of the coil 12 are, the larger the variation of the frequency $f_0$ is.

Further, in the oscillation circuit 100 according to the present embodiment, currents having phases reversed from each other flow respectively through the coil 11 and the coil 12. Therefore, since the magnetic field generated by the coil and the magnetic field generated by the coil 12 have directions opposite to each other to weaken each other, the deterioration of the oscillation signal due to the influence of the magnetic fields can be reduced.

Further, in contrast to the fact that an SAW resonator is steep in frequency characteristic with respect to the reactance, the SAW filter 2 is linear (gentle) in frequency characteristic with respect to the reactance. Therefore, the oscillation circuit 100 according to the present embodiment has an advantage that the control of the variation of the frequency $f_0$ is easy compared to the oscillation circuit using the SAW resonator.

Going back to FIG. 6, in the oscillation module 1, the capacitor 32, the capacitor 34, the differential amplifier 40, the capacitor 52, the capacitor 54, the multiplier circuit 60, the high-pass filter 70, and the output circuit 80 are disposed in the posterior stage of the oscillation circuit 100.

One end of the capacitor 32 is connected to the non-inverted output terminal (the output terminal OP20 in FIG. 7) of the differential amplifier 20, and the other end of the capacitor 32 is connected to the non-inverting input terminal of the differential amplifier 40. Further, one end of the capacitor 34 is connected to the inverted output terminal (the output terminal ON20 in FIG. 7) of the differential amplifier 20, and the other end of the capacitor 34 is connected to the inverting input terminal of the differential amplifier 40. The capacitor 32 and the capacitor 34 function as DC cutting capacitors to remove DC components of the respective signals output from the non-inverted output terminal (the output terminal OP20 in FIG. 7) and the inverted output terminal (the output terminal ON20 in FIG. 7) of the differential amplifier 20.

The differential amplifier 40 is disposed on the signal path from the oscillation circuit 100 to the multiplier circuit 60.

The differential amplifier 40 outputs the differential signals, which are obtained by amplifying the differential signals input to the non-inverting input terminal and the inverting input terminal, from a non-inverted output terminal and an inverted output terminal.

Figure 9:
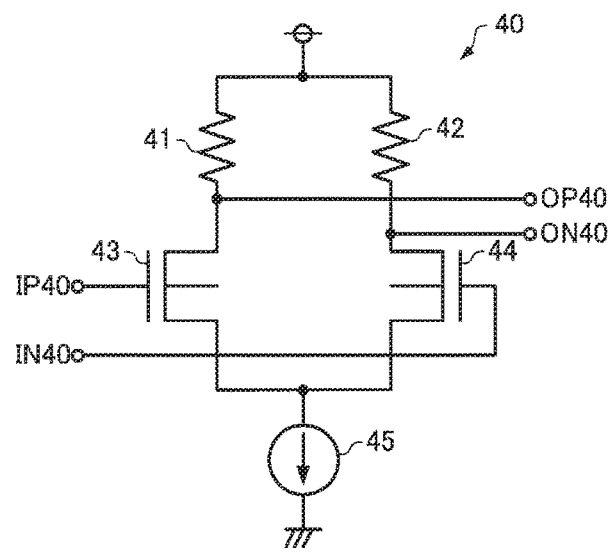
FIG. 9 is a diagram showing an example of a circuit configuration of a differential amplifier 40.

FIG. 9 is a diagram showing an example of a circuit configuration of the differential amplifier 40. In the example shown in FIG. 9, the differential amplifier 40 is configured including a resistor 41, a resistor 42, an NMOS transistor 43, an NMOS transistor 44, and a constant current source 45. In FIG. 9, for example, an input terminal IP40 is a non-inverting input terminal, and an input terminal IN40 is an inverting input terminal. Further, an output terminal OP40 is a non-inverted output terminal, and an output terminal ON40 is an inverted output terminal.

In the NMOS transistor 43, the gate terminal is connected to the input terminal IP40, the source terminal is connected to one end of the constant current source 45, and the drain terminal is connected to the power supply terminal T7 (see FIG. 6) via the resistor 41.

In the NMOS transistor 44, the gate terminal is connected to the input terminal IN40, the source terminal is connected to the one end of the constant current source 45, and the drain terminal is connected to the power supply terminal T7 (see FIG. 6) via the resistor 42.

The other end of the constant current source 45 is connected to the ground terminal T8 (see FIG. 6).

Further, the drain terminal of the NMOS transistor 43 is connected to the output terminal OP40, and the drain terminal of the NMOS transistor 44 is connected to the output terminal ON40.

The differential amplifier 40 configured as described above non-inversely amplifies differential signals input to the input terminal IP40 and the input terminal IN40, and then outputs the differential signals thus amplified from the output terminal OP40 and the output terminal ON40.

Going back to FIG. 6, one end of the capacitor 52 is connected to the non-inverted output terminal (the output terminal OP40 in FIG. 9) of the differential amplifier 40, and the other end of the capacitor 52 is connected to the non-inverting input terminal of the multiplier circuit 60. Further, one end of the capacitor 54 is connected to the inverted output terminal (the output terminal ON40 in FIG. 9) of the differential amplifier 40, and the other end of the capacitor 54 is connected to the inverting input terminal of the multiplier circuit 60. The capacitor 52 and the capacitor 54 function as DC cutting capacitors to remove DC components of the respective signals output from the non-inverted output terminal (the output terminal OP40 in FIG. 9) and the inverted output terminal (the output terminal ON40 in FIG. 9) of the differential amplifier 40.

The multiplier circuit 60 operates in a differential manner, and outputs the differential signals, which are obtained by multiplying the frequency $f_0$ of the differential signals input to the non-inverting input terminal and the inverting input terminal, from a non-inverted output terminal and an inverted output terminal.

Figure 10:
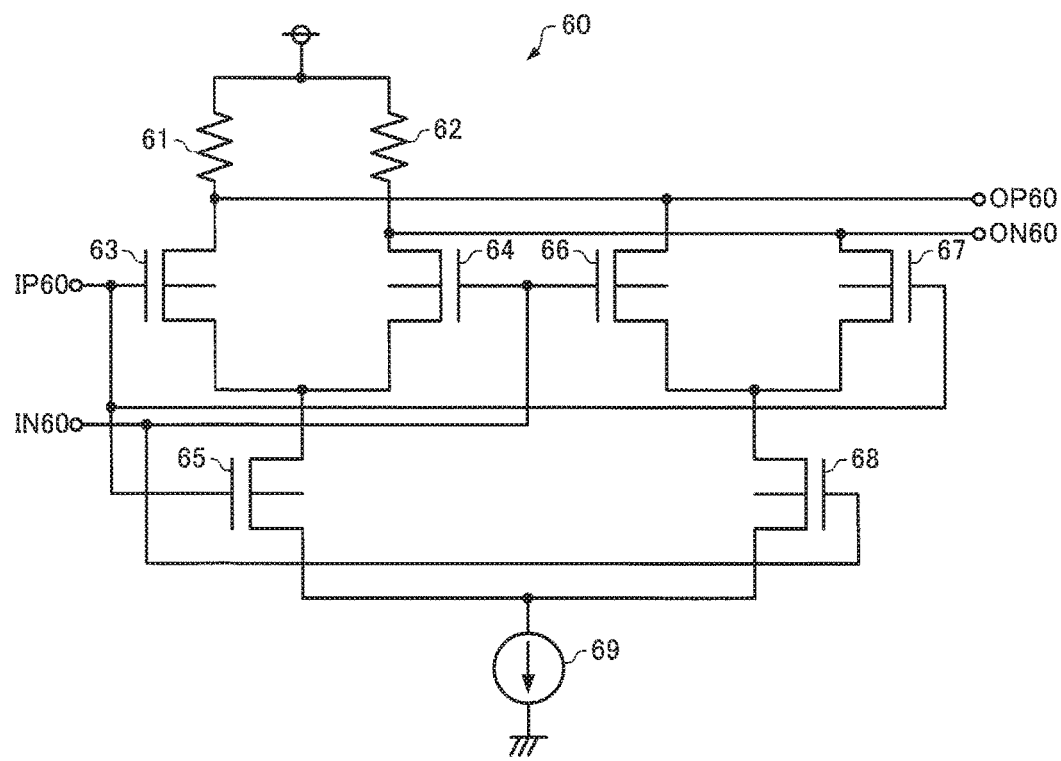
FIG. 10 is a diagram showing an example of a circuit configuration of a multiplier circuit 60.

FIG. 10 is a diagram showing an example of a circuit configuration of the multiplier circuit 60. In the example shown in FIG. 10, the multiplier circuit 60 is configured including a resistor 61, a resistor 62, an NMOS transistor 63, an NMOS transistor 64, an NMOS transistor 65, an NMOS transistor 66, an NMOS transistor 67, and NMOS transistor 68, and a constant current source 69. In FIG. 10, for example, an input terminal IP60 is a non-inverting input terminal, and an input terminal IN60 is an inverting input terminal. Further, an output terminal OP60 is a non-inverted output terminal, and an output terminal ON60 is an inverted output terminal.

In the NMOS transistor 63, the gate terminal is connected to the input terminal IP60, the source terminal is connected to the drain terminal of the NMOS transistor 65, and the drain terminal is connected to the power supply terminal T7 (see FIG. 6) via the resistor 61.

In the NMOS transistor 64, the gate terminal is connected to the input terminal IN60, the source terminal is connected to the drain terminal of the NMOS transistor 65, and the drain terminal is connected to the power supply terminal T7 (see FIG. 6) via the resistor 62.

In the NMOS transistor 65, the gate terminal is connected to the input terminal IP60, the source terminal is connected to one end of the constant current source 69, and the drain terminal is connected to the source terminal of the NMOS transistor 63 and the source terminal of the NMOS transistor 64.

In the NMOS transistor 66, the gate terminal is connected to the input terminal IN60, the source terminal is connected to the drain terminal of the NMOS transistor 68, and the drain terminal is connected to the power supply terminal T7 (see FIG. 6) via the resistor 61.

In the NMOS transistor 67, the gate terminal is connected to the input terminal IP60, the source terminal is connected to the drain terminal of the NMOS transistor 68, and the drain terminal is connected to the power supply terminal T7 (see FIG. 6) via the resistor 62.

In the NMOS transistor 68, the gate terminal is connected to the input terminal IN60, the source terminal is connected to the one end of the constant current source 69, and the drain terminal is connected to the source terminal of the NMOS transistor 66 and the source terminal of the NMOS transistor 67.

The other end of the constant current source 69 is connected to the ground terminal T8 (see FIG. 6).

Further, the drain terminal of the NMOS transistor 63 and the drain terminal of the NMOS transistor 66 are connected to the output terminal OP60, and the drain terminal of the NMOS transistor 64 and the drain terminal of the NMOS transistor 67 are connected to the output terminal ON60.

The multiplier circuit 60 configured as described above generates differential signals with the frequency $2f_0$ twice as high as the frequency $f_0$ of the differential signals input to the input terminal IP60 and the input terminal IN60, and then outputs the result from the output terminal OP60 and the output terminal ON60. In particular, the multiplier circuit 60 is a balanced modulation circuit, and in principle, has a configuration in which the differential signals (the signals with the frequency $f_0$) input to the input terminal IP60 and the input terminal IN60 are not output from the output terminal OP60 and the output terminal ON60. According to this multiplier circuit 60, it is possible to reduce the signal component with the frequency $f_0$ output from the output terminal OP60 and the output terminal ON60 even taking the production tolerance of the NMOS transistors and the resistors into consideration, and the differential signals with the frequency $2f_0$ high in purity (high in frequency accuracy) can be obtained, and at the same time, the circuit area is also relatively small.

Going back to FIG. 6, the non-inverted output terminal (the output terminal OP60 in FIG. 10) of the multiplier circuit 60 is connected to a non-inverting input terminal of the high-pass filter 70. Further, the inverted output terminal (the output terminal ON60 in FIG. 10) of the multiplier circuit 60 is connected to an inverting input terminal of the high-pass filter 70.

The high-pass filter 70 is disposed on the signal path from the multiplier circuit 60 to the output circuit 80. The high-pass filter 70 operates in a differential manner, and outputs the differential signals, which are obtained by attenuating the low-frequency component of the differential signals input to the non-inverting input terminal and the inverting input terminal, from a non-inverted output terminal and an inverted output terminal.

Figure 11:
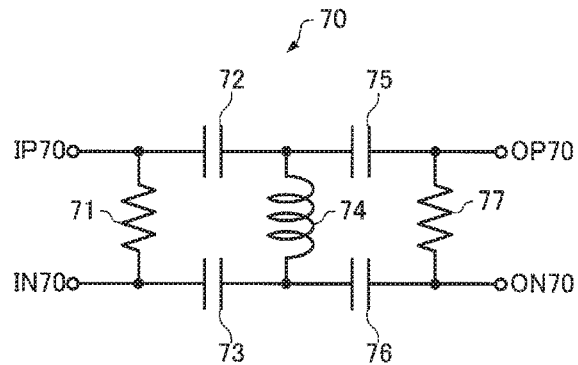
FIG. 11 is a diagram showing an example of a circuit configuration of a high-pass filter 70.

FIG. 11 is a diagram showing an example of a circuit configuration of the high-pass filter 70. In the example shown in FIG. 11, the high-pass filter 70 is configured including a resistor 71, a capacitor 72, a capacitor 73, a coil 74, a capacitor 75, a capacitor 76, and a resistor 77. In FIG. 11, for example, an input terminal IP70 is a non-inverting input terminal, and an input terminal IN70 is an inverting input terminal. Further, an output terminal OP70 is a non-inverted output terminal, and an output terminal ON70 is an inverted output terminal.

One end of the resistor 71 is connected to the input terminal IP70 and one end of the capacitor 72, and the other end of the resistor 71 is connected to the input terminal IN70 and one end of the capacitor 73.

The one end of the capacitor 72 is connected to the input terminal IP70 and the one end of the resistor 71, and the other end of the capacitor 72 is connected to one end of the coil 74 and one end of the capacitor 75.

The one end of the capacitor 73 is connected to the input terminal IN70 and the other end of the resistor 71, and the other end of the capacitor 73 is connected to the other end of the coil 74 and one end of the capacitor 76.

The one end of the coil 74 is connected to the other end of the capacitor 72 and the one end of the capacitor 75, and the other end of the coil 74 is connected to the other end of the capacitor 73 and the one end of the capacitor 76.

The one end of the capacitor 75 is connected to the other end of the capacitor 72 and the one end of the coil 74, and the other end of the capacitor 75 is connected to one end of the resistor 77.

The one end of the capacitor 76 is connected to the other end of the capacitor 73 and the other end of the coil 74, and the other end of the capacitor 76 is connected to the other end of the resistor 77.

The one end of the resistor 77 is connected to the other end of the capacitor 75, and the other end of the resistor 77 is connected to the other end of the capacitor 76.

Further, the other end of the capacitor 75 and the one end of the resistor 77 are connected to the output terminal OP70, and the other end of the capacitor 76 and the other end of the resistor 77 are connected to the output terminal ON70.

The high-pass filter 70 configured as described above generates the differential signals, which are obtained by attenuating the low-frequency component of the differential signals input to the input terminal IP70 and the input terminal IN70, and then outputs the result from the output terminal OP70 and the output terminal ON70.

Figure 12:
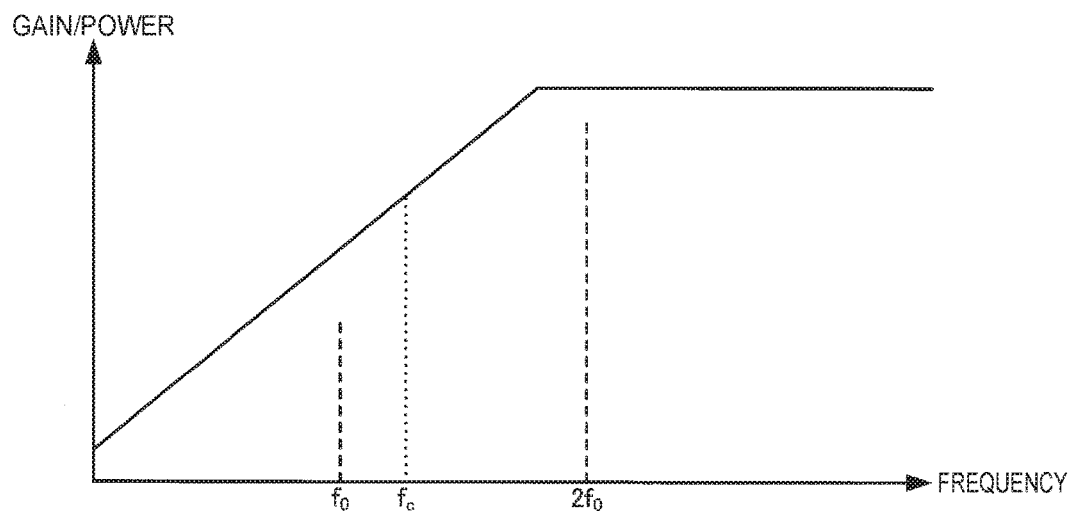
FIG. 12 is a diagram showing an example of the frequency characteristic of the high-pass filter 70.

FIG. 12 is a diagram showing an example of the frequency characteristic of the high-pass filter 70. In FIG. 12, the frequency spectrum of the output signal of the multiplier circuit 60, which is the input signal of the high-pass filter 70, is also illustrated with the dotted lines. In FIG. 12, the horizontal axis represents the frequency, and the vertical axis represents the gain (in the case of the frequency characteristic of the high-pass filter 70) or the power (in the case of the frequency spectrum of the output signal of the multiplier circuit 60). As shown in FIG. 12, the resistance values of the respective resistors, the capacitance values of the respective capacitors, and the inductance value of the coil 74 are set so that the cutoff frequency $f_c$ of the high-pass filter 70 takes a value between $f_0$ and $2f_0$. As described above, although the multiplier circuit 60 outputs the differential signals with the frequency $2f_0$ high in purity (high in frequency accuracy) and small in signal component of $f_0$, since the signal component of $f_0$ lower than the cutoff frequency $f_c$ is attenuated by the high-pass filter as shown in FIG. 12, the differential signals with the frequency $2f_0$ higher in purity (higher in frequency accuracy) can be obtained.

Going back to FIG. 6, the non-inverted output terminal (the output terminal OP70 in FIG. 11) of the high-pass filter 70 is connected to a non-inverting input terminal of the output circuit 80. Further, the inverted output terminal (the output terminal ON70 in FIG. 11) of the high-pass filter 70 is connected to an inverting input terminal of the output circuit 80.

The output circuit 80 is disposed in the posterior stage of the multiplier circuit 60 and the high-pass filter 70. The output circuit 80 operates in a differential manner, generates the differential signals, which are obtained by converting the differential signals input to the non-inverting input terminal and the inverting input terminal into signals having desired voltage levels (or current levels), and outputs the result from a non-inverted output terminal and an inverted output terminal. The non-inverted output terminal of the output circuit 80 is connected to an output terminal T5 of the integrated circuit 3, and the inverted output terminal of the output circuit 80 is connected to an output terminal T6 of the integrated circuit 3. The output terminal T5 of the integrated circuit 3 is connected to a CP terminal as the external terminal of the oscillation module 1, and the output terminal T6 of the integrated circuit 3 is connected to a CN terminal as the external terminal of the oscillation module 1. Further, the differential signals (the oscillation signals) converted by the output circuit 80 are output to the outside from the CP terminal and the CN terminal of the oscillation module 1 via the output terminal T5 and the output terminal T6 of the integrated circuit 3.

Figure 13:
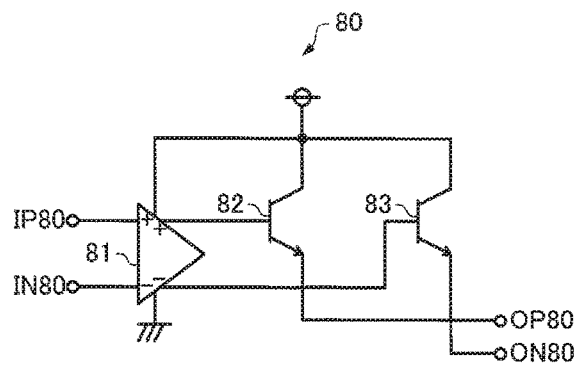
FIG. 13 is a diagram showing an example of a circuit configuration of an output circuit 80.

FIG. 13 is a diagram showing an example of a circuit configuration of the output circuit 80. In the example shown in FIG. 13, the output circuit 80 is configured including a differential amplifier 81, an NPN transistor 82, and an NPN transistor 83. In FIG. 13, for example, an input terminal IP80 is a non-inverting input terminal, and an input terminal IN80 is an inverting input terminal. Further, an output terminal OP80 is a non-inverted output terminal, and an output terminal ON80 is an inverted output terminal.

In the differential amplifier 81, the non-inverting input terminal is connected to the input terminal IP80, the inverting input terminal is connected to the input terminal IN80, the non-inverted output terminal is connected to the base terminal of the NPN transistor 82, the inverted output terminal is connected to the base terminal of the NPN transistor 83, and the differential amplifier 81 operates with the power supply voltage VDD supplied from the power supply terminal T7 (see FIG. 6) and the ground terminal T8.

In the NPN transistor 82, the base terminal is connected to the non-inverted output terminal of the differential amplifier 81, the collector terminal is connected to the power supply terminal T7 (see FIG. 6), and the emitter terminal is connected to the output terminal OP80.

In the NPN transistor 83, the base terminal is connected to the inverted output terminal of the differential amplifier 81, the collector terminal is connected to the power supply terminal T7 (see FIG. 6), and the emitter terminal is connected to the output terminal ON80.

The output circuit 80 configured as described above is a PECL (positive emitter coupled logic) circuit or an LV-PECL (low-voltage positive emitter coupled logic) circuit, and by pulling down the output terminal OP80 and the output terminal ON80 to a predetermined potential V1, the output circuit 80 converts the differential signals input from the input terminal IP80 and the input terminal IN80 into differential signals, the high level of which is defined as VDD-$V_{CE}$, and the low level of which is defined as V1, and then outputs the result from the output terminal OP80 and the output terminal ON80. It should be noted that $V_{CE}$ denotes the voltage between the collector and the emitter of the NPN transistor 82 or the NPN transistor 83.

1-3. Layout of Integrated Circuit

In the oscillation module 1 according to the present embodiment, in order to realize the power supply wiring (a power supply path) provided with a sufficient current supply capacity, the layout of the integrated circuit 3 is devised.

Figure 14:
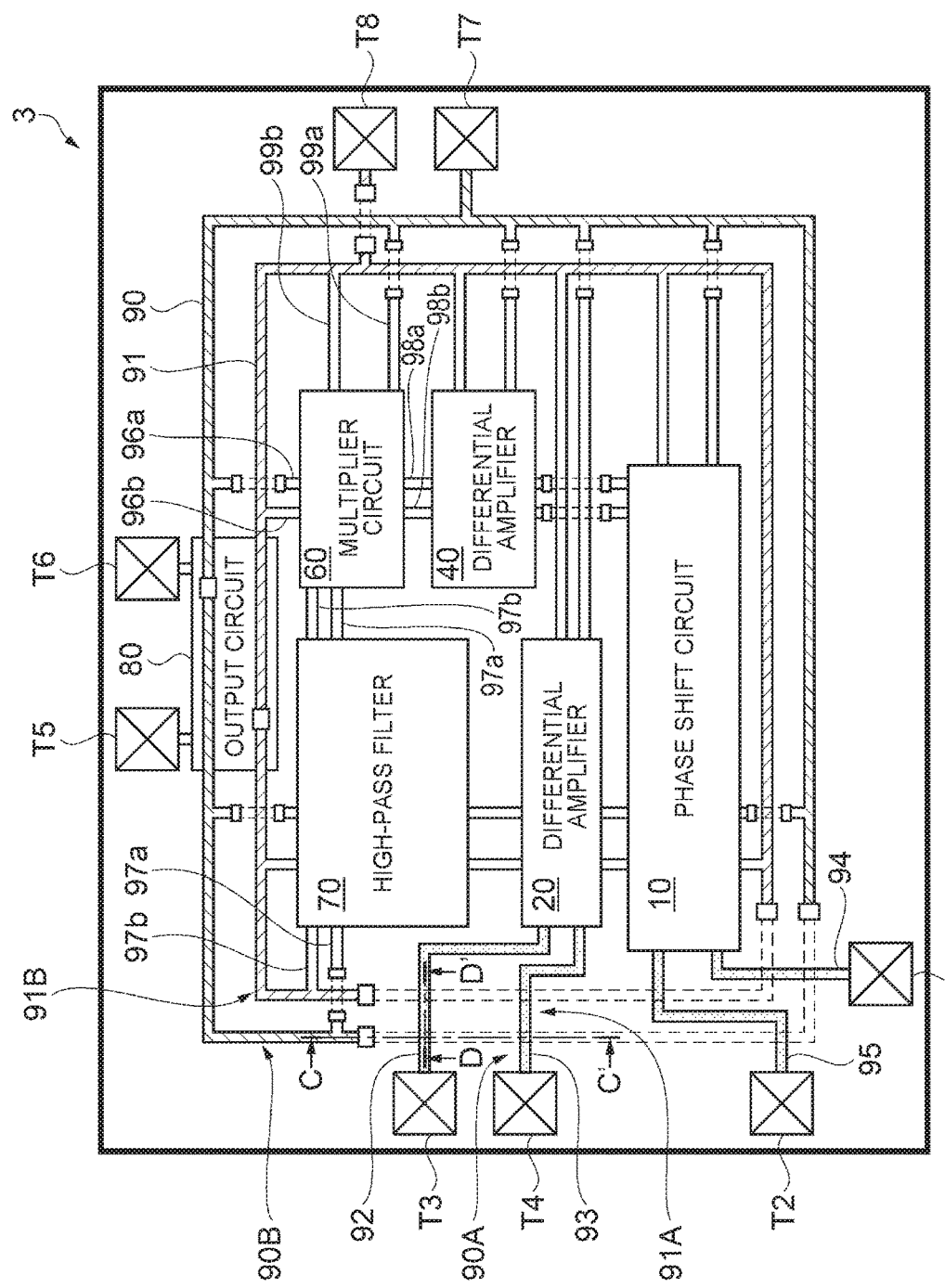
FIG. 14 is a diagram showing an example of a layout arrangement of the integrated circuit 3.

FIG. 14 is a diagram showing an example of a layout arrangement of the power supply interconnections, high-frequency signal interconnections, and the circuits (except some of the circuits), and is a plan view of the integrated circuit 3 viewed from a direction perpendicular to the surface of the semiconductor substrate on which the variety of elements (e.g., the transistors and the resistors) are stacked.

Figure 15:
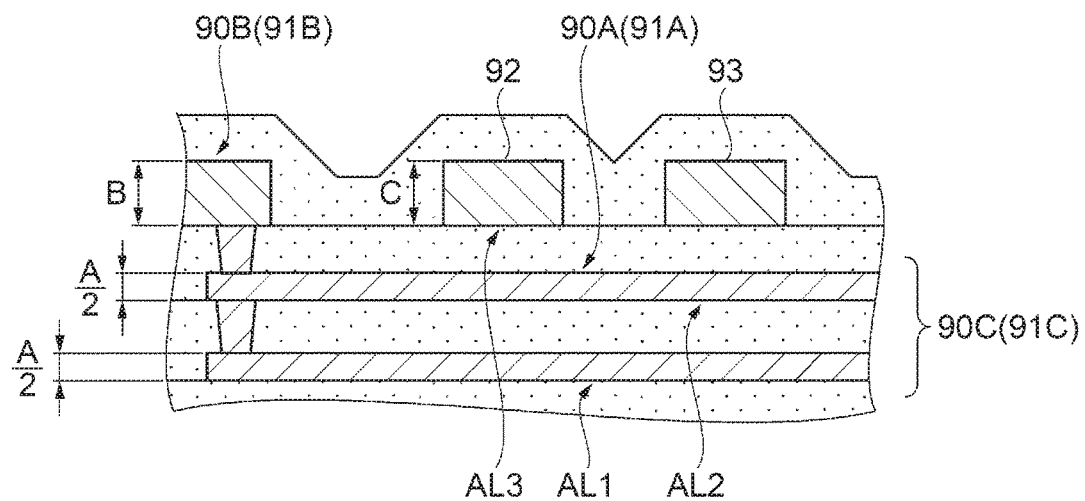
FIG. 15 is a cross-sectional view of a principal part of the integrated circuit 3 cut along the line C-C' shown in FIG. 14.
Figure 16:
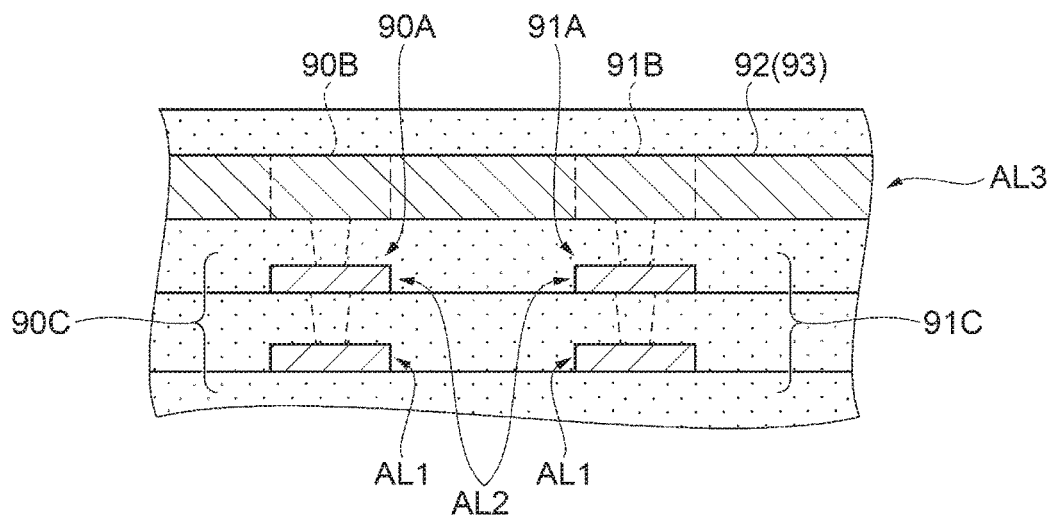
FIG. 16 is a cross-sectional view of a principal part of the integrated circuit 3 cut along the line D-D' shown in FIG. 14.

FIG. 15 is a cross-sectional view of a principal part of the integrated circuit 3 cut along the line C-C' shown in FIG. 14, and FIG. 16 is a cross-sectional view of a principal part of the integrated circuit 3 cut along the line D-D' shown in FIG. 14.

As shown in FIG. 14 through FIG. 16, in the oscillation module 1, the integrated circuit 3 is provided with a pair of loop interconnections 90, 91, the differential amplifier 20 as a first circuit, high-frequency output interconnections 92, 93 from the differential amplifier 20 as a pair of first interconnections, and the output terminals T3, T4 as a pair of first terminals.

It should be noted that the oscillation module 1 is further provided with high-frequency input interconnections 94, 95 (corresponding to the first interconnections), the phase-shift circuit 10 (corresponding to the first circuit), and the input terminals T1, T2 (corresponding to the first terminals) as other constituents corresponding to the first interconnections, the first circuit, and the first terminals. In the present embodiment, there is presented the description with a focus on the high-frequency output interconnections 92, 93 as the first interconnections, the differential amplifier 20 as the first circuit, and the output terminals T3, T4 as the first terminals.

The loop interconnections 90, 91 are power supply lines, and are disposed to form loops (frame-like shapes) so as to surround the circuits (except the output circuit 80) in the planar view. The outer loop interconnection 90 is connected to the power supply terminal T7, and the inner loop interconnection 91 is connected ground terminal T8.

The loop interconnection 90 is supplied with the desired power supply potential (the VDD potential) via the VDD terminal as the external electrode disposed on the surface of the package 4, and the loop interconnection 91 is supplied with the ground potential (0V, the VSS potential) via the VSS terminal as the external electrode disposed on the surface of the package 4.

The high-frequency output interconnections 92, 93 as the first interconnections are high-frequency signal lines, and connect the output terminals T3, T4 and the differential amplifier 20 to each other.

Through the high-frequency output interconnections 92, 93, the high-frequency signals (see FIG. 8) reverse in phase from each other amplified by the differential amplifier 20 flow from the differential amplifier 20 toward the output terminal T3, T4.

The high-frequency output interconnections 92, 93 connect the output terminals T3, T4 located outside the loop interconnections 90, 91 and the differential amplifier 20 located inside the loop interconnections 90, 91 to each other, and are therefore disposed so as to cross the loop interconnections 90, 91 in a grade-separated manner.

In the present embodiment, the loop interconnections 90, 91 cross the high-frequency output interconnections 92, in a grade-separated manner so as to pass under the high-frequency output interconnections 92, 93 in crossing parts 90A, 91A with the high-frequency output interconnections 92, 93.

The loop interconnections 90, 91 are each different in the thickness between the crossing parts 91A, 91A with the high-frequency output interconnections 92, 93 and non-crossing parts 90B, 91B.

Further, the thicknesses of the high-frequency output interconnections 92, 93 are different from the thicknesses of the crossing parts 90A, 91A of the loop interconnections 90, 91.

The loop interconnections 90, 91 and the high-frequency output interconnections 92, 93 are disposed in a plurality of wiring layers AL1, AL2, and AL3 stacked on one another, and the high-frequency output interconnections 92, 93 are disposed in the wiring layer AL3, which is the same as the wiring layer of the non-crossing parts 90B, 91B of the loop interconnections 90, 91.

The crossing parts 90A, 91A of the loop interconnections 90, 91 include multilayer interconnection parts 90C, 91C disposed in the plurality of wiring layers AL1, AL2 stacked on one another, respectively.

Here, defining the thickness of the crossing parts 90A, 91A of the loop interconnections 90, 91 as A (in FIG. 15, A=A/2+A/2), and the thickness of the non-crossing parts 90B, 91B as B, the relationship of A<B (B is thicker than A) is fulfilled.

Further, since the high-frequency output interconnections 92, 93 are disposed in the wiring layer AL3, which is the same as the wiring layer of the non-crossing parts 90B, 91B of the loop interconnections 90, 91, defining the thickness of each of the high-frequency interconnections 92, 93 as C, the relationship of B=C (B and C are the same thickness) is fulfilled.

As shown in FIG. 15 and FIG. 16, the loop interconnections 90, 91 are disposed so as to straddle the plurality of wiring layers AL1, AL2, and AL3 stacked on one another, and the non-crossing parts 90B, 91B are disposed in the wiring layer AL3, which is an upper layer of the wiring layers AL1, AL2 where the crossing parts 90A, 91A are disposed.

It should be noted that the oscillation module 1 has basically the same configuration as described above even in the case of setting the high-frequency input interconnections 94, 95 as the first interconnections, the phase shift circuit 10 as the first circuit, and the input terminals T1, T2 as the first terminals.

Going back to FIG. 14, in the oscillation module 1, the integrated circuit 3 is provided with the loop interconnections 90, 91, a multiplier circuit block (the multiplier circuit) 60 as a first circuit block (here, "block" is attached to the end of the word as an expression including a physical formation area of the circuit), a pair of second interconnections 96a, 96b and a pair of third interconnections 99a, 99b for electrically connecting the loop interconnections 90, 91 and the multiplier circuit block 60 to each other.

The second interconnections 96a, 96b are disposed along a first direction (here, a direction from the multiplier circuit block 60 toward the output terminal T6) of the multiplier circuit block 60 in the planar view.

The third interconnections 99a, 99b are disposed along a second direction (here, a direction from the multiplier circuit block 60 toward the ground terminal T8) different from the first direction in the planar view.

Thus, it results that the multiplier circuit block 60 is electrically connected to the loop interconnections 90, 91 from the two directions with the second interconnections 96a, 96b and the third interconnections 99a, 99b.

Further, in the oscillation module 1, the integrated circuit 3 is provided with a high-pass filter block (the high-pass filter) 70 as a second circuit block disposed between the output terminal T3 and the multiplier circuit block 60.

Here, temporarily assuming the third interconnections as interconnections 97a, 97b disposed along a direction from the multiplier circuit block 60 toward the output terminal T3, it results that third interconnections (97a, 97b) electrically connect the loop interconnections 90, 91 and the multiplier circuit block 60 to each other via the high-pass filter block 70.

Further, in the oscillation module 1, the integrated circuit 3 is provided with at least one of (here, both of) a pair of fourth interconnections 98a, 98b and a pair of fifth interconnections 97a, 97b for electrically connecting the loop interconnections 90, 91 and the multiplier circuit block 60 to each other in addition to the second interconnections 96a, 96b and the third interconnections 99a, 99b (here, the third interconnections has been restored).

The fourth interconnections 98a, 98b are disposed along a third direction (here, a direction from the multiplier circuit block 60 toward an opposite direction to the output terminal T6) different from the first direction and the second direction of the multiplier circuit block 60 in the planar view.

The fifth interconnections 97a, 97b are disposed along a fourth direction (here, a direction from the multiplier circuit block 60 toward the output terminal T3) different from the first direction, the second direction, and the third direction of the multiplier circuit block 60 in the planar view.

Thus, it results that the multiplier circuit block 60 is electrically connected to the loop interconnections 90, 91 from all directions (the four directions) with the second through fifth interconnections.

It should be noted that the first circuit block is not limited to the multiplier circuit block 60, but other circuit blocks (e.g., a phase shift circuit block 10, a differential amplifier block (the differential amplifier) 20, a differential amplifier block (the differential amplifier) 40, or a high-pass filter block 70) can also be adopted.

These circuit blocks are electrically connected to each other with at least the interconnections (corresponding to either of the second through fifth interconnections) along the two directions different from each other, and it results that the other circuit blocks intervening between the present circuit block and the loop interconnections 90, 91 corresponds to the second circuit block.

According to the above, it results that the second through fifth interconnections are disposed in a grid-like manner (net-like manner) throughout the entire area inside the loop interconnections 90, 91 via the circuit blocks.

It should be noted that although in the drawings, there is adopted a configuration in which the output circuit block 80 is electrically connected directly to the loop interconnections 90, 91, it is possible to adopt a configuration in which the output circuit block 80 is electrically connected to the loop interconnections 90, 91 with at least the interconnections along the two direction different from each other among the second through fifth interconnections similarly to the above.

Further, although in FIG. 14, there is disposed the plurality of circuit blocks inside the loop interconnections 90, 91, it is also possible to adopt a configuration with a single circuit block (the first circuit block) alone, or it is also possible to adopt a configuration of including just two circuit blocks, wherein one is defined as the first circuit block, and the other is defined as the second circuit block.

As described above, in the oscillation module 1 according to the present embodiment, the high-frequency output interconnections 92, 93 as the first interconnections, which connects the differential amplifier 20 as the first circuit and the output terminals T3, T4 as the first terminals to each other, crosses the loop interconnections 90, 91 in a grade-separated manner. Further, the loop interconnections 90, 91 are each different in the thickness between the crossing parts 91A, 91A with the high-frequency output interconnections 92, 93 and the non-crossing parts 90B, 91B. Further, in the oscillation module 1, the crossing parts 90A, 91A of the loop interconnections 90, 91 include the multilayer interconnection parts 90C, 91C disposed in the plurality of wiring layers AL1, AL2 stacked on one another, respectively.

Thus, in the oscillation module 1, the thicknesses of the loop interconnections 90, 91 can be made thinner than the non-crossing parts 90B, 91B in the crossing parts 90A, 91A with the high-frequency output interconnections 92, 93, and can be made thicker than the crossing parts 90A, 91A in the non-crossing parts 90B, 91B with the high-frequency output interconnections 92, 93.

Therefore, in the case in which the loop interconnections 90, 91 are the power supply lines, it is possible for the oscillation module 1 to provide the power supply interconnections (the power supply path) provided with the sufficient current supply capacity while suppressing the total thickness of the both interconnections in the crossing parts 90A, 91A.

Further, in the oscillation module 1, since the thicknesses of the high-frequency output interconnections 92, 93 are different from the thicknesses of the crossing parts 90A, 91A of the loop interconnections 90, 91, by making the thicknesses of the high-frequency output interconnections 92, 93 thicker than the thicknesses of the crossing parts 90A, 91A of the loop interconnections 90, 91, the impedance can be lowered.

Therefore, in the oscillation module 1, it is possible to improve the characteristics of the signals (here the high-frequency signals) flowing between the differential amplifier 20 and the output terminals T3, T4.

Further, in the oscillation module 1, since the high-frequency output interconnections 92, 93 are disposed in the wiring layer AL3, which is the same as the wiring layer of the non-crossing parts 90B, 91B of the loop interconnections 90, 91, it is possible to form the high-frequency output interconnections 92, 93 and the non-crossing parts 90B, 91B of the loop interconnections 90, 91 in a lump using, for example, the semiconductor manufacturing process.

Further, in the oscillation module 1, defining the total thickness of each of the crossing parts 90A, 91A of the loop interconnections 90, 91 as A, and the thickness of each of the non-crossing parts 90B, 91B as B, A<B is fulfilled. Therefore, the thicknesses of the loop interconnections 90, 91 can be made thinner than the non-crossing parts 90B, 91B in the crossing parts 90A, 91A with the high-frequency output interconnections 92, 93, and can be made thicker than the crossing parts 90A, 91A in the non-crossing parts 90B, 91B with the high-frequency output interconnections 92, 93.

Therefore, in the case in which the loop interconnections 90, 91 are the power supply lines, it is possible for the oscillation module 1 to provide the power supply interconnections provided with the sufficient current supply capacity while suppressing the total thickness of the both interconnections in the crossing parts 90A, 91A.

Further, in the oscillation module 1, the loop interconnections 90, 91 are disposed so as to straddle the plurality of wiring layers AL1, AL2, and AL3 stacked on one another, and the non-crossing parts 90B, 91B are disposed in the wiring layer AL3, which is the upper layer of the crossing parts 90A, 91A. Therefore, it is possible to easily form the non-crossing parts 90B, 91B so as to be thicker than the crossing parts 90A, 91A.

Further, since the loop interconnections 90, 91 are the power supply lines, it is possible for the oscillation module 1 to provide the power supply interconnections provided with the sufficient current supply capacity while suppressing the electrical interference (e.g., superposition of the noise) with the high-frequency output interconnections 92, 93 in the crossing parts 90A, 91A.

Further, in the oscillation module 1, the second interconnections 96a, 96b for electrically connecting the loop interconnections 90, 91 and the multiplier circuit block (the multiplier circuit) 60 as the first circuit block to each other are disposed along the first direction of the multiplier circuit block 60 in the planar view, and the third interconnections 99a, 99b for electrically connecting the loop interconnections 90, 91 and the multiplier circuit block 60 to each other in a similar manner are disposed along the second direction of the multiplier circuit block 60 in the planar view.

Thus, it results that in the oscillation module 1, the first circuit block is supplied with the electrical power from the two directions (through the two paths) in the case in which the loop interconnections 90, 91 are the power supply lines.

Therefore, in the oscillation module 1, even if the first circuit block is a circuit block relatively high in current consumption, it is possible to supply the sufficient electrical power from the loop interconnections with little variation.

Further, in the oscillation module 1, assuming the third interconnections as 97a, 97b, at least one (here, the third interconnections 97a, 97b) of the second interconnections 96a, 96b and the third interconnections 97a, 97b electrically connect the loop interconnections 90, 91 and the multiplier circuit block 60 to each other via the high-pass filter block 70 as the second circuit block.

Thus, it results that in the oscillation module 1, the multiplier circuit block 60 is supplied with the electrical power through the two paths via the high-pass filter block 70 in the case in which the loop interconnections 90, 91 are the power supply lines.

Therefore, in the oscillation module 1, even if the multiplier circuit block 60 is a circuit block relatively high in current consumption, it is possible to supply the sufficient electrical power from the loop interconnections 90, 91 with little variation via the high-pass filter block 70.

Further, in the oscillation module 1, the layout design including the power supply interconnections can be made more efficient compared to the case of individually supplying the multiplier circuit block 60 and the high-pass filter block 70 with the electrical power.

Further, in the oscillator module 1, since the fourth interconnections 98a, 98b are disposed along the third direction in the planar view, and the fifth interconnections 97a, 97b are disposed along the fourth direction in the planar view, in the case in which the loop interconnections 90, 91 are the power supply lines, it results that the multiplier circuit block 60 is supplied with the electrical power from the four directions (through the four paths).

Therefore, in the oscillation module 1, even if the multiplier circuit block 60 is a circuit block relatively high in current consumption, it is possible to supply the further sufficient electrical power from the loop interconnections 90, 91 with little variation.

Further, in the oscillation module 1, since the loop interconnections 90, 91 have a predetermined potential (here, the loop interconnection 90 has the VDD potential, and the loop interconnection 91 has the VSS potential), it is possible to reliably operate the multiplier circuit block 60 at the predetermined potentials (voltages) using the plurality of paths from the loop interconnections 90, 91 to the multiplier circuit block 60.

Further, in the oscillation module 1, since the interconnections corresponding to the second interconnections 96a, 96b through the fifth interconnections 97a, 97b are disposed in a grid-like manner (net-like manner) via the circuit blocks through out the entire area inside the loop interconnections 90, 91, it is possible to supply the sufficient electrical power from the loop interconnections 90, 91 to the circuit blocks with little variation.

2. Electronic Apparatus

Figure 17:
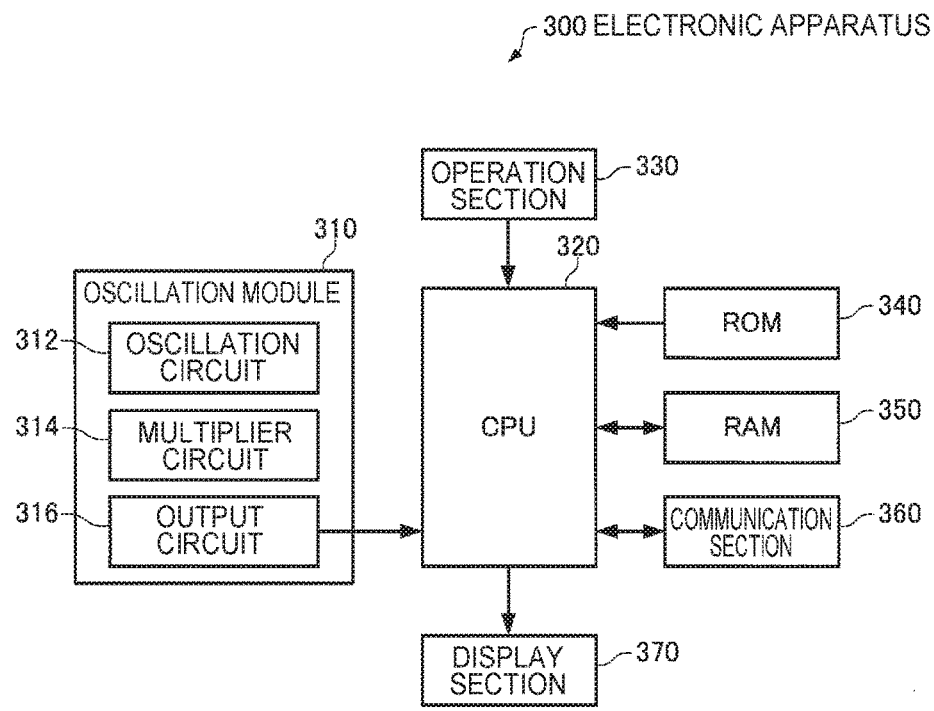
FIG. 17 is a functional block diagram showing an example of a configuration of an electronic apparatus 300 according to an embodiment of the invention.

FIG. 17 is a functional block diagram showing an example of a configuration of an electronic apparatus according to the embodiment. The electronic apparatus 300 according to the present embodiment is configured including an oscillation module 310, a central processing unit (CPU) 320, an operation section 330, a read only memory (ROM) 340, a random access memory (RAM) 350, a communication section 360, and a display section 370. It should be noted that the electronic apparatus according to the present embodiment can be provided with a configuration obtained by eliminating or modifying some of the constituents (sections) shown in FIG. 17, or adding other constituents thereto.

The oscillation module 310 is provided with an oscillation circuit 312. The oscillation circuit 312 is provided with an SAW filter not shown, and generates an oscillation signal with a frequency based on the resonance frequency of the SAW filter.

Further, the oscillation module 310 can also be provided with a multiplier circuit 314 and an output circuit 316 located in the posterior stage of the oscillation circuit 312. The multiplier circuit 314 generates an oscillation signal obtained by multiplying the frequency of the oscillation signal generated by the oscillation circuit 312. Further, the output circuit 316 outputs the oscillation signal generated by the multiplier circuit 314 or the oscillation signal generated by the oscillation circuit 312 to the CPU 320. The oscillation circuit 312, the multiplier circuit 314, and the output circuit 316 can operate in a differential manner.

The CPU 320 performs a variety of types of arithmetic processing and control processing using the oscillation signal input from the oscillation module 310 as a clock signal in accordance with the program stored in the ROM 340 and so on. Specifically, the CPU 320 performs a variety of processes corresponding to the operation signal from the operation section 330, a process of controlling the communication section 360 for performing data communication with external devices, a process of transmitting a display signal for making the display section 370 display a variety of types of information, and so on.

The operation section 330 is an input device constituted by operation keys, button switches, and so on, and outputs the operation signal corresponding to the operation by the user to the CPU 320.

The ROM 340 stores the programs, data, and so on for the CPU 320 to perform the variety of types of arithmetic processing and control processing.

The RAM 350 is used as a working area of the CPU 320, and temporarily stores, for example, the programs and the data retrieved from the ROM 340, the data input from the operation section 330, and the calculation result obtained by the CPU 320 performing operations in accordance with the variety of types of programs.

The communication section 360 performs a variety of types of control for achieving the data communication between the CPU 320 and the external devices.

The display section 370 is a display device formed of a liquid crystal display (LCD) or the like, and displays a variety of types of information based on the display signal input from the CPU 320. The display section 370 can also be provided with a touch panel, which functions as the operation section 330.

By applying, for example, the oscillation circuit 100 according to the embodiment described above as the oscillation circuit 312, or by applying, for example, the oscillation module 1 according to the embodiment described above as the oscillation module 310, it is possible to realize the electronic apparatus high in reliability.

As such an electronic apparatus 300, a variety of electronic apparatuses can be adopted, and there can be cited, for example, a network apparatus such as an optical transmission device using an optical fiber or the like, a broadcast apparatus, a communication apparatus used in an artificial satellite or a base station, a GPS (global positioning system) module, a personal computer (e.g., a mobile type personal computer, a laptop personal computer, and a tablet personal computer), a mobile terminal such as a smartphone or a cellular phone, a digital camera, an inkjet ejection device (e.g., an inkjet printer), a storage area network apparatus such as a router or a switch, a local area network apparatus, a base station apparatus for a mobile terminal, a television set, a video camera, a video cassette recorder, a car navigation system, a real-time clock device, a pager, a personal digital assistance (including one having a communication function), an electronic dictionary, an electronic calculator, an electronic game machine, a gaming controller, a word processor, a workstation, a picture phone, a security television monitor, an electronic binoculars, a POS (point of sale) terminal, a medical instrument (e.g., an electronic thermometer, a blood pressure monitor, a blood glucose monitor, an electrocardiograph, ultrasonic diagnostic equipment, and an electronic endoscope), a fish finder, a variety of measuring instruments, gauges (e.g., gauges for cars, aircrafts, and boats and ships), a flight simulator, a head-mount display, a motion tracer, a motion tracker, a motion controller, and a pedestrian dead reckoning (PDR) system.

As an example of the electronic apparatus 300 according to the present embodiment, there can be cited a transmission device using the oscillation module 310 described above as a reference signal source, and functioning as, for example, a terminal base station device for communicating with terminals wirelessly or with wire. By applying, for example, the oscillation module 1 according to the embodiment described above as the oscillation module 310, it is also possible to realize the electronic apparatus 300 which can be used for, for example, a communication base station, which is higher in frequency accuracy than ever before, and for which high performance and high reliability are required.

Further, as another example of the electronic apparatus 300 according to the present embodiment, it is possible to adopt a communication device in which the communication section 360 receives an external clock signal, and the CPU 320 (the processing section) includes a frequency control section for controlling the frequency of the oscillation module 310 based on the external clock signal and the output signal of the oscillation module 310.

3. Moving Object

Figure 18:
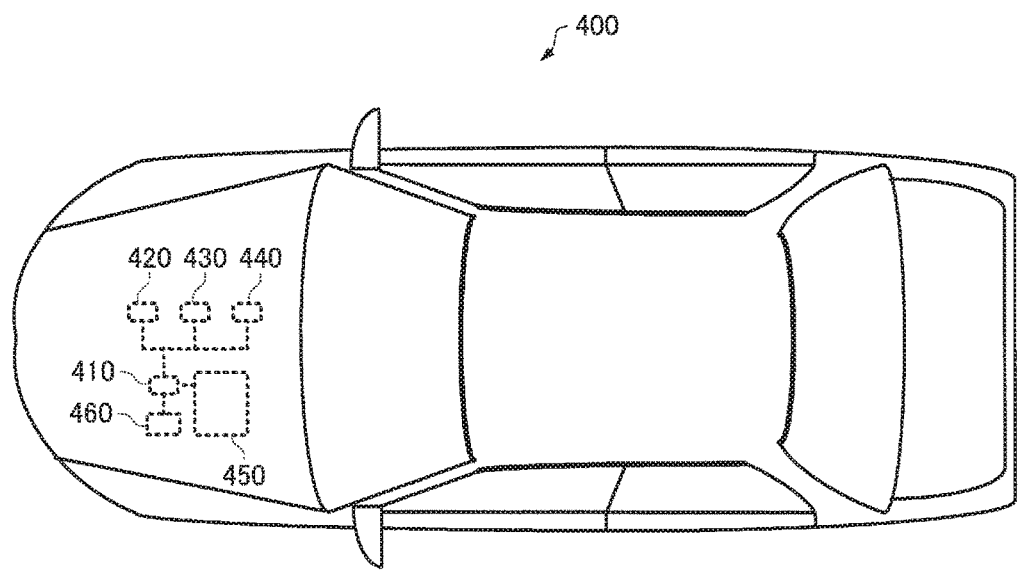
FIG. 18 is a diagram showing an example of a moving object 400 according to an embodiment of the invention.

FIG. 18 is a diagram (a top view) showing an example of a moving object according to the present embodiment. The moving object 400 shown in FIG. 18 is configured including an oscillation module 410, controllers 420, 430, and 440 for performing a variety of types of control such as an engine system, a brake system, or a keyless entry system, a battery 450, and a backup battery 460. It should be noted that the moving object according to the present embodiment can have a configuration obtained by eliminating some of the constituents (sections) shown in FIG. 18, or adding other constituents thereto.

The oscillation module 410 is provided with an oscillation circuit (not shown) provided with an SAW filter not shown, and generates the oscillation signal with a frequency based on the resonance frequency of the SAW filter.

Further, the oscillation module 410 can also be provided with a multiplier circuit and an output circuit located in the posterior stage of the oscillation circuit. The multiplier circuit generates an oscillation signal obtained by multiplying the frequency of the oscillation signal generated by the oscillation circuit. Further, the output circuit outputs the oscillation signal generated by the multiplier circuit or the oscillation signal generated by the oscillation circuit. The oscillation circuit, the multiplier circuit, and the output circuit can operate in a differential manner.

The oscillation signal output by the oscillation module 410 is supplied to the controllers 420, 430, and 440, and is used as, for example, a clock signal.

The battery 450 supplies the oscillation module 410 and the controllers 420, 430, and 440 with electrical power. The backup battery 460 supplies the oscillation module 410 and the controllers 420, 430, and 440 with the electrical power when the output voltage of the battery 450 drops to a level lower than a threshold value.

By applying, for example, the oscillation circuit 100 according to the embodiment described above as the oscillation circuit provided to the oscillation module 410, or by applying, for example, the oscillation module 1 according to the embodiment described above as the oscillation module 410, it is possible to realize the moving object high in reliability.

As such a moving object 400, there can be adopted a variety of types of moving objects, and there can be cited a vehicle (including an electric vehicle), an aircraft such as a jet plane or a helicopter, a ship, a boat, a rocket, an artificial satellite, and so on.

The embodiments described above are illustrative only, and the invention is not limited to the present embodiment, but can be put into practice with various modification within the scope or the spirit of the invention.

The invention includes configurations (e.g., configurations having the same function, the same way, and the same result, or configurations having the same object and the same advantage) substantially the same as the configuration described as the embodiment of the invention. Further, the invention includes configurations obtained by replacing a non-essential part of the configuration described as the embodiment of the invention. Further, the invention includes configurations exerting the same functional effects and configurations capable of achieving the same object as the configuration described as one of the embodiments of the invention. Further, the invention includes configurations obtained by adding known technologies to the configuration described as one of the embodiments of the invention.

The entire disclosure of Japanese Patent Application No. 2016-002309, filed Jan. 8, 2016 is expressly incorporated by reference herein.

What is claimed is:

1. An oscillation module comprising:
   a loop interconnection;
   a first interconnection;
   a first circuit; and
   a first terminal,
   wherein the first circuit is connected to the first terminal with the first interconnection,
   the first interconnection crosses the loop interconnection in a grade-separated manner, and
   the loop interconnection at least partially encircles one or more circuits of an integrated circuit including the first circuit to define a loop around a perimeter of the integrated circuit, the first interconnection crosses the loop defined by the loop interconnection to connect the first terminal outside of the defined loop to the first circuit within the defined loop, and the loop interconnection is different in thickness between a crossing part and a non-crossing part with the first interconnection.

2. The oscillation module according to claim 1, wherein the crossing part of the loop interconnection includes a multilayer interconnection part disposed in a plurality of wiring layers stacked on one another.

3. The oscillation module according to claim 1, wherein the first interconnection is different in thickness from the crossing part of the loop interconnection.

4. The oscillation module according to claim 2, wherein the first interconnection is different in thickness from the crossing part of the loop interconnection.

5. The oscillation module according to claim 1, wherein the loop interconnection and the first interconnection are disposed in a plurality of wiring layers stacked on one another, and
   the first interconnection is disposed in the wiring layer, which is the same as the wiring layer of the non-crossing part of the loop interconnection.

6. The oscillation module according to claim 2, wherein the loop interconnection and the first interconnection are disposed in a plurality of wiring layers stacked on one another, and
   the first interconnection is disposed in the wiring layer, which is the same as the wiring layer of the non-crossing part of the loop interconnection.

7. The oscillation module according to claim 1, wherein defining the thickness of the crossing part of the loop interconnection as A, and the thickness of the non-crossing part as B,
   A<B is fulfilled.

8. The oscillation module according to claim 1, wherein the loop interconnection is disposed so as to straddle a plurality of wiring layers stacked on one another, and the non-crossing part is disposed in the wiring layer, which is an upper layer of the wiring layer where the crossing part is disposed.

9. The oscillation module according to claim 1, wherein the loop interconnection is a power supply line.

10. The oscillation module according to claim 1, wherein the first interconnection is a high-frequency signal line.

11. An oscillation module comprising:
   a loop interconnection corresponding to a first interconnection;
   a first circuit block; and
   a second interconnection and a third interconnection adapted to electrically connect the loop interconnection and the first circuit block to each other,
   wherein the second interconnection is disposed along a first direction of the first circuit block in a planar view,
   the third interconnection is disposed along a second direction different from the first direction of the first circuit block in the planar view, and
   the loop interconnection at least partially encircles one or more circuits of an integrated circuit including the first circuit block to define a loop around a perimeter of the integrated circuit, and the second and third interconnections cross the loop defined by the loop interconnection to connect respective terminals outside of the defined loop to the first circuit block within the defined loop.

12. The oscillation module according to claim 11, further comprising:
   a second circuit block,
   wherein at least one of the second interconnection and the third interconnection electrically connects the loop interconnection and the first circuit block to each other via the second circuit block.

13. The oscillation module according to claim 11, further comprising:
   at least one of a fourth interconnection and a fifth interconnection adapted to electrically connect the loop interconnection and the first circuit block to each other,
   wherein the fourth interconnection is disposed along a third direction different from the first direction and the second direction of the first circuit block in the planar view, and
   the fifth interconnection is disposed along a fourth direction different from the first direction, the second direction, the third direction, and the third direction of the first circuit block in the planar view.

14. The oscillation module according to claim 12, further comprising:
   at least one of a fourth interconnection and a fifth interconnection adapted to electrically connect the loop interconnection and the first circuit block to each other,
   wherein the fourth interconnection is disposed along a third direction different from the first direction and the second direction of the first circuit block in the planar view, and
   the fifth interconnection is disposed along a fourth direction different from the first direction, the second direction, the third direction, and the third direction of the first circuit block in the planar view.

15. The oscillation module according to claim 11, wherein the loop interconnection has a predetermined electrical potential.

16. The oscillation module according to claim 12, wherein the loop interconnection has a predetermined electrical potential.

17. An electronic apparatus comprising:
   the oscillation module according to claim 1.

18. An electronic apparatus comprising:
   the oscillation module according to claim 11.

19. A moving object comprising:
   the oscillation module according to claim 1.

20. A moving object comprising:
   the oscillation module according to claim 11.

* * * * *